United States Patent [19]

Matsuzawa et al.

[11] Patent Number: 6,104,544
[45] Date of Patent: Aug. 15, 2000

[54] EXPOSURE APPARATUS

[75] Inventors: Hitoshi Matsuzawa, Setagaya-ku; Mikihiko Ishii, Kitaadachi-gun; Issey Tanaka, Yokohama, all of Japan

[73] Assignee: Nikon Corporation, Japan

[21] Appl. No.: 08/885,694

[22] Filed: Jun. 30, 1997

Related U.S. Application Data

[63] Continuation of application No. 08/706,761, Sep. 3, 1996, abandoned, which is a continuation of application No. 08/384,081, Feb. 6, 1995, abandoned.

[30] Foreign Application Priority Data

Dec. 14, 1994 [JP] Japan ..................................... 6-311050

[51] Int. Cl.⁷ .............................. G02B 3/00; G02B 21/02; G02B 15/14; G02B 9/62
[52] U.S. Cl. ........................ 359/649; 359/656; 359/658; 359/679; 359/757
[58] Field of Search ........................... 359/649, 656–658, 359/679, 754, 755, 757, 766, 369, 385

[56] References Cited

U.S. PATENT DOCUMENTS

| | | | |
|---|---|---|---|
| 3,737,215 | 6/1973 | De Jager | 359/760 |
| 3,909,115 | 9/1975 | Kano et al. | 359/754 |
| 3,955,883 | 5/1976 | Sugiyama | 359/752 |
| 4,080,048 | 3/1978 | Kimura | 359/750 |
| 4,666,273 | 5/1987 | Shimizu et al. | 353/101 |
| 4,770,477 | 9/1988 | Shafer et al. | 359/355 |
| 4,772,107 | 9/1988 | Friedman et al. | 359/754 |
| 4,811,055 | 3/1989 | Hirose et al. | 355/53 |

(List continued on next page.)

FOREIGN PATENT DOCUMENTS

| | | |
|---|---|---|
| 3443856 | 6/1985 | Germany ................. 359/754 |
| 47-35017 | 9/1972 | Japan . |
| 55-12902 | 1/1980 | Japan . |
| A-58 004 112 | 1/1983 | Japan . |
| 63-118115 | 5/1988 | Japan . |
| A-63 118 115 | 5/1988 | Japan . |
| 4-157412 | 5/1992 | Japan . |
| A-05 173 065 | 7/1993 | Japan . |
| 6-313845 | 11/1994 | Japan . |
| 8-179204 | 7/1996 | Japan . |
| WO 93/04391 | 3/1993 | WIPO . |

OTHER PUBLICATIONS

J. Braat, "Quality of Microlithographic Projection Lenses", pp. 22–30, Proceedings of SPIE vol. 811, Optical Microlithographic Technology for Integrated Circuit Farbrication and Inspection (1987).

U.S. application No. 08/152,490, refiled as U.S. application No. 08/727,206, Which was Refiled as U.S. application No. 08/929,155; Apr. 23, 1999 Which was Allowed, But No Issue Date or Patent Number.

U. S. application No. 08/255927, filed Jun. 7, 1994, Nakashima et al. patent No. 5,534,970, issue date Jul. 9, 1996.

*Primary Examiner*—Georgia Epps
*Assistant Examiner*—Evelyn A. Lester
*Attorney, Agent, or Firm*—Pennie & Edmonds LLP

[57] ABSTRACT

A projection optical system of the present invention has a first lens group $G_1$ being positive, a second lens group $G_2$ being negative, a third lens group $G_3$ being positive, a fourth lens group $G_4$ being negative, a fifth lens group $G_5$ being positive, and a sixth lens group $G_6$ being positive in the named order from the first object toward the second object, in which the second lens group $G_2$ comprises an intermediate lens group $G_{2M}$ between a negative front lens $L_{2F}$ and a negative rear lens $L_{2R}$ and in which the intermediate lens group $G_{2M}$ is arranged to comprise at least a first positive lens being positive, a second lens being negative, a third lens being negative, and a fourth lens being negative in the named order from the first object toward the second object. The present invention involves findings of suitable focal length ranges for the first to the sixth lens groups $G_1$ to $G_6$ and an optimum range of an overall focal length of from the second negative lens to the fourth lens with respect to a focal length of the second lens group $G_2$.

84 Claims, 14 Drawing Sheets

U.S. PATENT DOCUMENTS

| | | | |
|---|---|---|---|
| 4,891,663 | 1/1990 | Hirose et al. | 343/786 |
| 4,977,426 | 12/1990 | Hirose et al. | 355/53 |
| 5,097,291 | 3/1992 | Suzuki et al. | 355/69 |
| 5,105,075 | 4/1992 | Ohta et al. | 250/201.2 |
| 5,159,496 | 10/1992 | Kataoka | 359/754 |
| 5,170,207 | 12/1992 | Tezuka et al. | 355/53 |
| 5,194,893 | 3/1993 | Nishi et al. | 355/53 |
| 5,235,465 | 8/1993 | Hayashi | 359/656 |
| 5,245,384 | 9/1993 | Mori et al. | 355/67 |
| 5,247,324 | 9/1993 | Estelle | 359/679 |
| 5,260,832 | 11/1993 | Togino et al. | 359/679 |
| 5,493,402 | 2/1996 | Hirukawa | 356/400 |
| 5,506,684 | 4/1996 | Ota et al. | 356/401 |
| 5,781,278 | 7/1998 | Matsuzawa et al. | 359/757 |
| 5,805,344 | 9/1998 | Sasaya et al. | 359/649 |
| 5,831,770 | 11/1998 | Matsuzawa et al. | 359/649 |
| 5,835,285 | 11/1998 | Matsuzawa et al. | 359/649 |
| 5,856,884 | 1/1999 | Mercado | 359/649 |

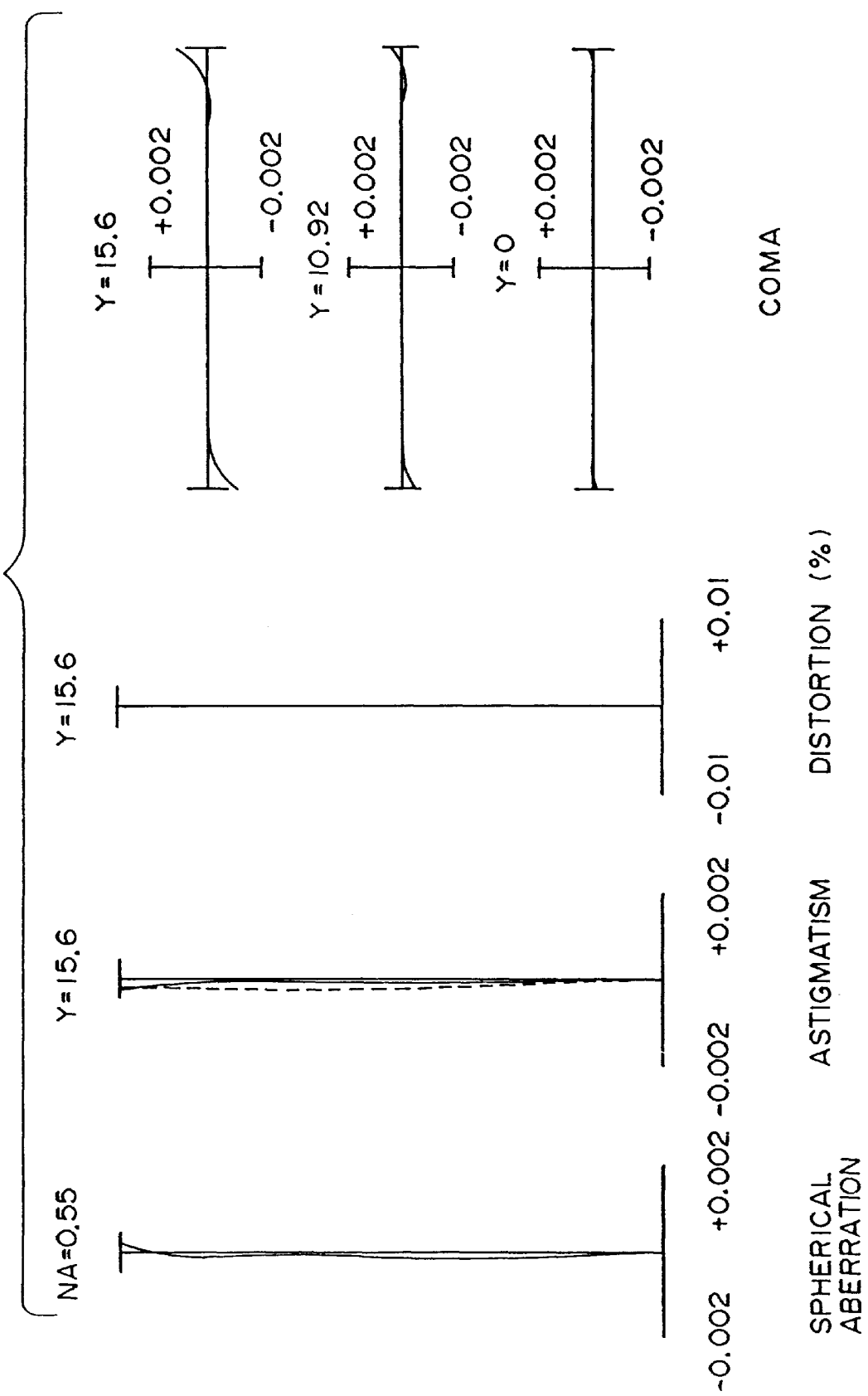

EXPOSURE APPARATUS

This is a continuation of application Ser. No. 08/706,761, filed Sep. 3, 1996, which is a continuation application of application Ser. No. 08/384,081, filed Feb. 6, 1995, both now abandoned.

BACKGROUND OF THE INVENTION

1. Field of the Invention

The present invention relates to an exposure apparatus having a projection optical system for projecting a pattern of a first object onto a photosensitive substrate or the like as a second object, and more particularly to a projection optical system suitably applicable to projection exposure of a pattern for semiconductor or liquid crystal formed on a reticle (mask) as the first object onto the substrate (semiconductor wafer, plate, etc.) as the second object.

2. Related Background Art

As the patterns of integrated circuits become finer and finer, the resolving power required for the exposure apparatus used in printing of wafer also becomes higher and higher. In addition to the improvement in resolving power, the projection optical systems of the exposure apparatus are required to decrease image stress.

Here, the image stress includes those due to bowing or the like of the printed wafer on the image side of projection optical system and those due to bowing or the like of the reticle with circuit pattern written therein, on the object side of projection optical system, as well as distortion caused by the projection optical system.

With a recent further progress of fineness tendency of transfer patterns, demands for decreasing the image stress are also becoming greater.

In order to decrease effects of the wafer bowing on the image stress, the conventional technology has employed the so-called image-side telecentric optical system that locates the exit pupil position at a farther point on the image side of projection optical system.

On the other hand, the image stress due to the bowing of reticle can also be reduced by employing a so-called object-side telecentric optical system that locates the entrance pupil position of projection optical system at a farther point from the object plane, and there are suggestions to locate the entrance pupil position of projection optical system at a relatively far position from the object plane as described. Examples of those suggestions are described for example in Japanese Laid-open Patent Applications No. 63-118115 and No. 5-173065 and U.S. Pat. No. 5,260,832.

SUMMARY OF THE INVENTION

An object of the invention is to provide an exposure apparatus having a high-performance projection optical system which can correct the aberrations, particularly the distortion, very well even in the bitelecentric arrangement while keeping a relatively wide exposure area and a large numerical aperture.

To achieve the above object, the present invention involves an exposure apparatus having a high-performance projection optical system comprising a stage allowing a photosensitive substrate (for example, a semiconductor wafer coated with a photosensitive material such as a photoresist) to be held on a main surface thereof, an illumination optical system having a light source for emitting exposure light of a predetermined wavelength and transferring a predetermined pattern on a mask onto the substrate, and a projecting optical system for projecting an image of the mask, on the substrate surface. The above projecting optical system projects an image of a first object (for example, a mask with a pattern such as an integrated circuit) onto a second object (for example, a photosensitive substrate).

As shown in FIG. 1, the projection optical system has a first lens group $G_1$ with positive refracting power, a second lens group $G_2$ with negative refracting power, a third lens group $G_3$ with positive refracting power, a fourth lens group $G_4$ with negative refracting power, a fifth lens group $G_5$ with positive refracting power, and a sixth lens group $G_6$ with positive refracting power in the named order from the side of the first object R. The and the second lens group $G_2$ further comprises a front lens $L_{2F}$ placed as closest to the first object R and having negative refracting power with a concave surface to the second object W, a rear lens $L_{2R}$ placed as closest to the second object and having negative refracting power with a concave surface to the first object R, and an intermediate lens group $G_{2M}$ placed between the front lens $L_{2F}$ in the second lens group $G_2$ and the rear lens $L_{2R}$ in the second lens group $G_2$. The intermediate lens group $G_{2M}$ has a first lens $L_{M1}$ with positive refracting power, a second lens $L_{M2}$ with negative refracting power, a third lens $L_{M3}$ with negative refracting power, and a fourth lens $L_{M4}$ with negative refracting power in the named order from the side of the first object R.

First, the first lens group $G_1$ with positive refracting power contributes mainly to a correction of distortion while maintaining telecentricity, and specifically, the first lens group $G_1$ is arranged to generate a positive distortion to correct in a good balance negative distortions caused by the plurality of lens groups located on the second object side after the first lens group $G_1$. The second lens group $G_2$ with negative refracting power and the fourth lens group $G_4$ with negative refracting power contribute mainly to a correction of Petzval sum to make the image plane flat. The two lens groups of the second lens group $G_2$ with negative refracting power and the third lens group $G_3$ with positive refracting power form an inverse telescopic system to contribute to guarantee of back focus (a distance from an optical surface such as a lens surface closest to the second object W in the projection optical system to the second object W) in the projection optical system. The fifth lens group $G_5$ with positive refracting power and the sixth lens group $G_6$ similarly with positive refracting power contribute mainly to suppressing generation of distortion and suppressing generation particularly of spherical aberration as much as possible in order to fully support high NA structure on the second object side.

Based on the above structure, the front lens $L_{2F}$ placed as closest to the first object R in the second lens group $G_2$ and having the negative refracting power with a concave surface to the second object W contributes to corrections of curvature of field and coma, and the rear lens $L_{2R}$ placed as closest to the second object W in the second lens group $G_2$ and having the negative refracting power with a concave surface to the first object R to corrections of curvature of field, coma, and astigmatism. In the intermediate lens group $G_{2M}$ placed between the front lens $L_{2F}$ and the rear lens $L_{2R}$, the first lens $L_{M1}$ with positive refracting power contributes to a correction of negative distortions caused by the second to fourth lenses $L_{M2}$–$L_{M4}$ with negative refracting power greatly contributing to the correction of curvature of field.

In particular, in the above projecting optical system, the following conditions (1) to (5) are satisfied when a focal length of the first lens group $G_1$ is $f_1$, a focal length of the second lens group $G_2$ is $f_2$, a focal length of the third lens group $G_3$ is $f_3$, a focal length of the fourth lens group $G_4$ is $f_4$, a focal length of the fifth lens group $G_5$ is $f_5$, a focal length of the sixth lens group $G_6$ is $f_6$, an overall focal length of the second to the fourth lenses $L_{M2}$–$L_{M4}$ in the intermediate lens group $G_{2M}$ in the second lens group $G_2$ is $f_n$, and a distance from the first object R to the second object W is L:

$$0.1 < f_1/f_3 < 17 \tag{1}$$

$$0.1 < f_2/f_4 < 14 \tag{2}$$

$$0.01 < f_5/L < 0.9 \tag{3}$$

$$0.02 < f_6/L < 1.6 \tag{4}$$

$$0.01 < f_n/f_2 < 2.0. \tag{5}$$

The condition (1) defines an optimum ratio between the focal length $f_1$ of the first lens group $G_1$ with positive refracting power and the focal length $f_3$ of the third lens group $G_3$ with positive refracting power, which is an optimum refracting power (power) balance between the first lens group $G_1$ and the third lens group $G_3$. This condition (1) is mainly for correcting the distortion in a good balance. Below the lower limit of this condition (1) a large negative distortion is produced because the refracting power of the third lens group $G_3$ becomes relatively weak to the refracting power of the first lens group $G_1$. Above the upper limit of the condition (1) a large negative distortion is produced because the refracting power of the first lens group $G_1$ becomes relatively weak to the refracting power of the third lens group $G_3$.

The condition (2) defines an optimum ratio between the focal length $f_2$ of the second lens group $G_2$ with negative refracting power and the focal length $f_4$ of the fourth lens group $G_4$ with negative refracting power, which is an optimum refracting power (power) balance between the second lens group $G_2$ and the fourth lens group $G_4$. This condition (2) is mainly for keeping the Petzval sum small so as to correct the curvature of field well while securing a wide exposure field. Below the lower limit of the condition (2), a large positive Petzval sum appears because the refracting power of the fourth lens group $G_4$ becomes relatively weak to the refracting power of the second lens group $G_2$. Above the upper limit of the condition (2) a large positive Petzval sum appears because the refracting power of the second lens group $G_2$ becomes relatively weak to the refracting power of the fourth lens group $G_4$. In order to correct the Petzval sum in a better balance under a wide exposure field by making the refracting power of the fourth lens group $G_4$ strong relative to the refracting power of the second lens group $G_2$, the lower limit of the above condition (2) is preferably set to 0.8, i.e., $0.8 < f_2/f_4$.

The condition (3) defines an optimum ratio between the focal length $f_5$ of the fifth lens group $G_5$ with positive refracting power and the distance (object-image distance) L from the first object R (reticle or the like) and the second object W (wafer or the like). This condition (3) is for correcting the spherical aberration, distortion, and Petzval sum in a good balance while keeping a large numerical aperture. Below the lower limit of this condition (3) the refracting power of the fifth lens group $G_5$ is too strong, so that this fifth lens group $G_5$ generates not only a negative distortion but also a great negative spherical aberration. Above the upper limit of this condition (3) the refracting power of the fifth lens group $G_5$ is too weak, so that the refracting power of the fourth lens group $G_4$ with negative refracting power inevitably also becomes weak therewith, thereby resulting in failing to correct the Petzval sum well.

The condition (4) defines an optimum ratio between the focal length $f_6$ of the sixth lens group $G_6$ with positive refracting power and the distance (object-image distance) L from the first object R (reticle etc.) to the second object W (wafer or the like). This condition (4) is for suppressing generation of higher-order spherical aberrations and negative distortion while keeping a large numerical aperture. Below the lower limit of this condition (4) the sixth lens group $G_6$ itself produces a large negative distortion; above the upper limit of this condition (4) higher-order spherical aberrations appear.

The condition (5) defines an optimum ratio between the overall focal length $f_n$ of the second lens $L_{M2}$ with negative refracting power to the fourth lens $L_{M4}$ with negative refracting power in the intermediate lens group $G_{2M}$ in the second lens group $G_2$ and the focal length $f_2$ of the second lens group $G_2$. It should be noted that the overall focal length $f_n$, stated herein, of the second lens $L_{M2}$ with negative refracting power to the fourth lens $L_{M4}$ with negative refracting power in the intermediate lens group $G_{2M}$ in the second lens group $G_2$ means not only an overall focal length of three lenses, i.e., the second lens $L_{M2}$ to the fourth lens $L_{M4}$, but also an overall focal length of three or more lenses between the second lens $L_{M2}$ and the fourth lens $L_{M4}$ where there are a plurality of lenses between the second lens and the fourth lens.

This condition (5) is for keeping the Petzval sum small while suppressing generation of distortion. Below the lower limit of this condition (5), a great negative distortion appears because the overall refracting power becomes too strong, of the negative sublens group including at least three negative lenses of from the second negative lens $L_{M2}$ to the fourth negative lens $L_{M4}$ in the intermediate lens group $G_{2M}$ in the second lens group $G_2$. In order to sufficiently correct the distortion and coma, the lower limit of the above condition (5) is preferably set to 0.1, i.e., $0.1 < f_n/f_2$.

Above the upper limit of this condition (5) a great positive Petzval sum results because the refracting power of the negative sublens group including at least three negative lenses of from the second negative lens $L_{M2}$ to the fourth negative lens $L_{M4}$ in the intermediate lens group $G_{2M}$ in the second lens group $G_2$ becomes too weak. In addition, the refracting power of the third lens group $G_3$ also becomes weak. Thus, it becomes difficult to construct the projection optical system in a compact arrangement. In order to achieve a sufficiently compact design while well correcting the Petzval sum, the upper limit of the above condition (5) is preferably set to 1.3, i.e., $f_n/f_2 < 1.3$.

Further, the following condition (6) is preferably satisfied when the axial distance from the first object R to the first-object-side focal point F of the entire projection optical system is I and the distance from the first object R to the second object W is L.

$$1.0 < I/L \tag{6}$$

The condition (6) defines an optimum ratio between the axial distance I from the first object R to the first-object-side focal point F of the entire projection optical system and the distance (object-image distance) L from the first object R (reticle or the like) to the second object W (wafer or the like). Here, the first-object-side focal point F of the entire projection optical system means an intersecting point of outgoing light from the projection optical system with the optical axis after collimated light beams are let to enter the projection optical system on the second object side in the paraxial region with respect to the optical axis of the projection optical system and when the light beams in the paraxial region are outgoing from the projection optical system.

Below the lower limit of this condition (6) the first-object-side telecentricity of the projection optical system will become considerably destroyed, so that changes of magnification and distortion due to an axial deviation of the first object R will become large. As a result, it becomes difficult to faithfully project an image of the first object R at a desired magnification onto the second object W. In order to fully suppress the changes of magnification and distortion due to the axial deviation of the first object R, the lower limit of the above condition (6) is preferably set to 1.7, i.e., $1.7<I/L$. Further, in order to correct a spherical aberration and a distortion of the pupil both in a good balance while maintaining the compact design of the projection optical system, the upper limit of the above condition (6) is preferably set to 6.8, i.e., $I/L<6.8$.

Also, it is more preferable that the following condition (7) be satisfied when the focal length of the third lens $L_{M3}$ with negative refracting power in the intermediate lens group $G_{2M}$ in the second lens group $G_2$ is $f_{23}$ and the focal length of the fourth lens $L_{M4}$ with negative refracting power in the intermediate lens group $G_{2M}$ in the second lens group $G_2$ is $f_{24}$.

$$0.07<f_{24}/f_{23}<7. \qquad (7)$$

Below the lower limit of the condition (7) the refracting power of the fourth negative lens $L_{M4}$ becomes strong relative to the refracting power of the third negative lens $L_{M3}$, so that the fourth negative lens $L_{M4}$ generates a large coma and a large negative distortion. In order to correct the coma better while correcting the negative distortion, the lower limit of the above condition (7) is preferably set to 0.14, i.e., $0.14<f_{24}/f_{23}$. Above the upper limit of this condition (7) the refracting power of the third negative lens $L_{M3}$ becomes relatively strong relative to the refracting power of the fourth negative lens $L_{M4}$, so that the third negative lens $L_{M3}$ generates a large coma and a large negative distortion. In order to correct the negative distortion better while correcting the coma, the upper limit of the above condition (7) is preferably set to 3.5, i.e., $f_{24}/f_{23}<3.5$.

Further, it is more preferable that the following condition (8) be satisfied when the focal length of the second lens $L_{M2}$ with negative refracting power in the intermediate lens group $G_{2M}$ in the second lens group $G_2$ is $f_{22}$ and the focal length of the third lens $L_{M3}$ with negative refracting power in the intermediate lens group $G_{2M}$ in the second lens group $G_2$ is $f_{23}$.

$$0.1<f_{22}/f_{23}<10 \qquad (8)$$

Below the lower limit of the condition (8) the refracting power of the second negative lens $L_{M2}$ becomes strong relative to the refracting power of the third negative lens $L_{M3}$, so that the second negative lens $L_{M2}$ generates a large coma and a large negative distortion. In order to correct the negative distortion in a better balance, the lower limit of the above condition (8) is preferably set to 0.2, i.e., $0.2<f_{22}/f_{23}$. Above the upper limit of this condition (8) the refracting power of the third negative lens $L_{M3}$ becomes strong relative to the refracting power of the second negative lens $L_{M2}$, so that the third negative lens $L_{M3}$ generates a large coma and a large negative distortion. In order to correct the negative distortion in a better balance while well correcting the coma, the upper limit of the above condition (8) is preferably set to 5, i.e., $f_{22}/f_{23}<5$.

Also, it is more desirable that the following condition (9) be satisfied when the axial distance from the second-object-side lens surface of the fourth lens $L_{M4}$ with negative refracting power in the intermediate lens group $G_{2M}$ in the second lens group $G_2$ to the first-object-side lens surface of the rear lens $L_{2R}$ in the second lens group $G_2$ is D and the distance from the first object R to the second object W is L:

$$0.05<D/L<0.4. \qquad (9)$$

Below the lower limit of the condition (9) it becomes difficult not only to secure a sufficient back focus on the second object side but also to correct the Petzval sum well. Above the upper limit of the condition (9) a large coma and a large negative distortion appear. Further, for example, in order to avoid mechanical interference between a reticle stage for holding the reticle as the first object R and the first lens group $G_1$, there are cases that it is preferable to secure a sufficient space between the first object R and the first lens group $G_1$, but there is a problem that to secure the sufficient space will become difficult above the upper limit of the condition (9).

Also, the fourth lens group $G_4$ preferably satisfies the following condition when the focal length of the fourth lens group $G_4$ is $f_4$ and the distance from the first object R to the second object W is L.

$$-0.098<f_4/L<-0.005 \qquad (10)$$

Below the lower limit of the condition (10) the correction of spherical aberration becomes difficult, which is not preferable. Also, above the upper limit of the condition (10), the coma appears, which is not preferable. In order to well correct the spherical aberration and Petzval sum, the lower limit of the condition (10) is preferably set to −0.078, i.e., $-0.078<f_4/L$, and further, in order to suppress generation of coma, the upper limit of the condition (10) is preferably set to −0.047, i.e., $f_4/L<-0.047$.

Further, the second lens group $G_2$ preferably satisfies the following condition when the focal length of the second lens group $G_2$ is $f_2$ and the distance from the first object R to the second object W is L.

$$-0.8<f_2/L<-0.050 \qquad (11)$$

Here; below the lower limit of the condition (11), a positive Petzval sum results, which is not preferable. Also, above the upper limit of the condition (11), a negative distortion appears, which is not preferable. In order to better correct the Petzval sum, the lower limit of the condition (11) is preferably set to −0.16, i.e., $-0.16<f_2/L$, and in order to better correct the negative distortion and coma, the upper limit of the condition (11) is preferably set to −0.0710, i.e., $f_2/L<-0.0710$.

In order to well correct mainly the third-order spherical aberration, it is more desirable that the fifth lens group $G_5$ with positive refracting power have the negative meniscus lens $L_{54}$, and the positive lens $L_{53}$ placed adjacent to the concave surface of the negative meniscus lens $L_{54}$ and having a convex surface opposed to the concave surface of the negative meniscus lens $L_{54}$ and that the following condition (12) be satisfied when the radius of curvature of the concave surface in the negative meniscus lens $L_{54}$ in the fifth lens group $G_5$ is $r_{5n}$ and the radius of curvature of the convex surface opposed to the concave surface of the negative meniscus lens $L_{54}$ in the positive lens $L_{53}$ set adjacent to the concave surface of the negative meniscus lens $L_{54}$ in the fifth lens group $G_5$ is $r_{5p}$.

$$0<(r_{5p}-r_{5n})/(r_{5p}+r_{5n})<1 \qquad (12)$$

Below the lower limit of the condition (12), correction of the third-order spherical aberration becomes insufficient; conversely, above the upper limit of the condition (12), the correction of the third-order spherical aberration becomes excessive, which is not preferable. Here, in order to correct the third-order spherical aberration better, the lower limit of the condition (12) is more preferably set to 0.01, i.e., $0.01<(r_{5p}-r_{5n})/(r_{5p}+r_{5n})$ and the upper limit of the condition (12) is more preferably set to 0.7, i.e., $(r_{5p}-r_{5n})/(r_{5p}+r_{5n})<0.7$.

Here, it is preferred that the negative meniscus lens and the positive lens adjacent to the concave surface of the negative meniscus lens be set between the at least one positive lens in the fifth lens group $G_5$ and the at least one positive lens in the fifth lens group $G_5$. For example, a set of the megative meniscus lens $L_{54}$ and the positive lens $L_{53}$ is placed between the positive lenses $L_{52}$ and $L_{55}$. This arrangement can suppress generation of the higher-order spherical aberrations which tend to appear with an increase in NA.

Also, it is more desirable that the fourth lens group $G_4$ with negative refracting power have the front lens $L_{41}$ placed as closest to the first object R and having the negative refracting power with a concave surface to the second object W, the rear lens $L_{44}$ placed as closest to the second object W and having the negative refracting power with a concave surface to the first object R, and at least one negative lens placed between the front lens $L_{41}$ in the fourth lens group $G_4$ and the rear lens $L_{41}$ in the fourth lens group $G_4$ and that the following condition (13) be satisfied when a radius of curvature on the first object side in the rear lens $L_{44}$ placed as closest to the second object W in the fourth lens group $G_4$ is $r_{4F}$ and a radius of curvature on the second object side in the rear lens $L_{44}$ placed as closest to the second object W in the fourth lens group $G_4$ is $r_{4R}$.

$$-1.00 \leq (r_{4F}-r_{4R})/(r_{4F}+r_{4R})<0 \qquad (13)$$

Below the lower limit of the condition (13), the rear negative lens $L_{44}$ located closest to the second object W in the fourth lens group $G_4$ becomes of a double-concave shape, which generates higher-order spherical aberrations; conversely, above the upper limit of the condition (13), the rear negative lens $L_{44}$ located closest to the second object W in the fourth lens group $G_4$ will have positive refracting power, which will make the correction of Petzval sum more difficult.

Further, it is desirable that the fifth lens group $G_5$ have the negative lens $L_{58}$ with a concave surface to the second object W, on the most second object side thereof. This enables the negative lens $L_{58}$ located closest to the second object W in the fifth lens group $G_5$ to generate a positive distortion and a negative Petzval sum, which can cancel a negative distortion and a positive Petzval sum generated by the positive lenses in the fifth lens group $G_5$.

In this case, in order to suppress the negative distortion without generating the higher-order spherical aberrations in the lens $L_{61}$ located closest to the first object R in the sixth lens group $G_6$, it is desirable that the lens surface closest to the first object R have a shape with a convex surface to the first object R and that the following condition be satisfied when a radius of curvature on the second object side, of the negative lens $L_{58}$ placed as closest to the second object W in the fifth lens group $G_5$ is $r_{5R}$ and a radius of curvature on the first object side, of the lens $L_{61}$ placed as closest to the first object R in the sixth lens group $G_6$ is $r_{6F}$.

$$-0.90<(r_{5R}-r_{6F})/(r_{5R}+r_{6F})<-0.001 \qquad (14)$$

This condition (14) defines an optimum shape of a gas lens formed between the fifth lens group $G_5$ and the sixth lens group $G_6$. Below the lower limit of this condition (14) a curvature of the second-object-side concave surface of the negative lens $L_{58}$ located closest to the second object W in the fifth lens group $G_5$ becomes too strong, thereby generating higher-order comas. Above the upper limit of this condition (14) refracting power of the gas lens itself formed between the fifth lens group $G_5$ and the sixth lens group $G_6$ becomes weak, so that a quantity of the positive distortion generated by this gas lens becomes small, which makes it difficult to well correct a negative distortion generated by the positive lenses in the fifth lens group $G_5$. In order to fully suppress the generation of higher-order comas, the lower limit of the above condition (14) is preferably set to $-0.30$, i.e., $-0.30<(r_{5R}-r_{6F})/(r_{5R}+r_{6F})$.

Also, it is further preferable that the following condition be satisfied when a lens group separation between the fifth lens group $G_5$ and the sixth lens group $G_6$ is $d_{56}$ and the distance from the first object R to the second object W is L.

$$d_{56}/L<0.017 \qquad (15)$$

Above the upper limit of this condition (15), the lens group separation between the fifth lens group $G_5$ and the sixth lens group $G_6$ becomes too large, so that a quantity of the positive distortion generated becomes small. As a result, it becomes difficult to correct the negative distortion generated by the positive lens in the fifth lens group $G_5$ in a good balance.

Also, it is more preferable that the following condition be satisfied when a radius of curvature of the lens surface closest to the first object R in the sixth lens group $G_6$ is $r_{6F}$ and an axial distance from the lens surface closest to the first object R in the sixth lens group $G_6$ to the second object W is $d_6$.

$$0.50<d_6/r_{6F}<1.50 \qquad (16)$$

Below the lower limit of this condition (16), the positive refracting power of the lens surface closest to the first object R in the sixth lens group $G_6$ becomes too strong, so that a large negative distortion and a large coma are generated. Above the upper limit of this condition (16), the positive refracting power of the lens surface closest to the first object R in the sixth lens group $G_{61}$ becomes too weak, thus generating a large coma. In order to further suppress the generation of coma, the lower limit of the condition (16) is preferably set to 0.84, i.e., $0.84<d_6/r_{6F}$.

It is desirable that the following condition (17) be satisfied when the radius of curvature on the first object side in the negative lens $L_{58}$ located closest to the second object W in the fifth lens group $G_5$ is $r_{5F}$ and the radius of curvature on the second object side in the negative lens $L_{58}$ located closest to the second object W in the fifth lens group $G_5$ is $r_{5R}$.

$$0.30<(r_{5F}-r_{5R})/(r_{5F}+r_{5R})<1.28 \qquad (17)$$

Below the lower limit of this condition (17), it becomes difficult to correct both the Petzval sum and the coma; above the upper limit of this condition (17), large higher-order comas appear, which is not preferable. In order to further prevent the generation of higher-order comas, the upper limit of the condition (17) is preferably set to 0.93, i.e., $(r_{5F}-r_{5R})/(r_{5F}+r_{5R})<0.93$.

Further, it is desirable that the second-object-side lens surface of the first lens $L_{M1}$ with positive refracting power in the intermediate lens group $G_{2M}$ in the second lens group $G_2$ be of a lens shape with a convex surface to the second object W, and in this case, it is more preferable that the following condition (18) be satisfied when the refracting power on the second-object-side lens surface of the first positive lens $L_{M1}$ in the intermediate lens group $G_{2M}$ in the second lens group $G_2$ is $\Phi_{21}$ and the distance from the first object R to the second object W is L.

$$0.54 < 1/(\Phi_{21} \cdot L) < 10 \qquad (18)$$

The refracting power of the second-object-side lens surface, stated herein, of the first lens $L_{M1}$ with positive refracting power in the intermediate lens group $G_{2M}$ is given by the following formula when a refractive index of a medium for the first lens $L_{M1}$ is $n_1$, a refracting index of a medium in contact with the second-object-side lens surface of the first lens $L_{M1}$ is $n_2$, and a radius of curvature of the second-object-side lens surface of the first lens is $r_{21}$.

$$\Phi_{21} = (n_2 - n_1)/r_{21}$$

Below the lower limit of the condition (18), higher-order distortions appear; conversely, above the upper limit of the condition (18), it becomes necessary to correct the distortion more excessively by the first lens group $G_1$, which generates the spherical aberration of the pupil, thus being not preferable.

Further, it is more preferable that the following condition (19) be satisfied when the focal length of the first lens $L_{M1}$ with positive refracting power in the intermediate lens group $G_{2M}$ in the second lens group $G_2$ is $f_{21}$ and the distance from the first object R to the second object W is L.

$$0.230 < f_{21}/L < 0.40 \qquad (19)$$

Below the lower limit of the condition (19), a positive distortion appears; above the upper limit of the condition (19), a negative distortion appears, thus not preferable.

Also, the front lens $L_{2F}$ and rear lens $L_{2R}$ in the second lens group $G_2$ preferably satisfy the following condition when the focal length of the front lens $L_{2F}$ placed as closest to the first object R in the second lens group $G_2$ and having the negative refracting power with a concave surface to the second object W is $f_{2F}$ and the focal length of the rear lens $L_{2R}$ placed as closest to the second object W in the second lens group $G_2$ and having the negative refracting power with a concave surface to the first object R is $f_{2R}$.

$$0 \leq f_{2F}/f_{2R} < 18 \qquad (20)$$

The condition (20) defines an optimum ratio between the focal length $f_{2R}$ of the rear lens $L_{2R}$ in the second lens group $G_2$ and the focal length $f_{2F}$ of the front lens $L_{2F}$ in the second lens group $G_2$. Below the lower limit and above the upper limit of this condition (20), a balance is destroyed for refracting power of the first lens group $G_1$ or the third lens group $G_3$, which makes it difficult to correct the distortion well or to correct the Petzval sum and the astigmatism simultaneously well.

The following specific arrangements are desirable to provide the above respective lens groups with sufficient aberration control functions.

First, in order to provide the first lens group $G_1$ with a function to suppress generation of higher-order distortions and spherical aberration of the pupil, the first lens group $G_1$ preferably has at least two positive lenses; in order to provide the third lens group $G_3$ with a function to suppress degradation of the spherical aberration and the Petzval sum, the third lens group $G_3$ preferably has at least three positive lenses; further, in order to provide the fourth lens group $G_4$ with a function to suppress the generation of coma while correcting the Petzval sum, the fourth lens group $G_4$ preferably has at least three negative lenses. Further, in order to provide the fifth lens group $G_5$ with a function to suppress generation of the negative distortion and the spherical aberration, the fifth lens group $G_5$ preferably has at least five positive lenses; further, in order to provide the fifth lens group $G_5$ with a function to correct the negative distortion and the Petzval sum, the fifth lens group $G_5$ preferably has at least one negative lens. Also, in order to provide the sixth lens group $G_6$ with a function to converge light on the second object W without generating a large spherical aberration, the sixth lens group $G_6$ preferably has at least one positive lens.

In addition, in order to correct the Petzval sum better, the intermediate lens group $G_{2M}$ in the second lens group $G_2$ preferably has negative refracting power.

In order to provide the sixth lens group $G_6$ with a function to further suppress the generation of the negative distortion, the sixth lens group $G_6$ is preferably constructed of three or less lenses having at least one surface satisfying the following condition (21).

$$1/|\Phi L| < 20 \qquad (21)$$

where $\Phi$: refracting power of the lens surface;
L: object-image distance from the first object R to the second object W.

The refracting power of the lens surface stated herein is given by the following formula when the radius of curvature of the lens surface is r, a refracting index of a medium on the first object side, of the lens surface is $n_1$, and a medium on the second object side, of the lens surface is $n_2$.

$$\Phi = (n_2 - n_1)/r$$

Here, if there are four or more lenses having the lens surface satisfying this condition (21), the number of lens surfaces with some curvature, located near the second object W, becomes increased, which generates the distortion, thus not preferable.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

FIG. 14 is various aberration diagrams in the sixth embodiment according to the present invention.

DETAILED DESCRIPTION OF THE PREFERRED EMBODIMENTS

The embodiments according to the present invention will be described in detail in the following. An exposure apparatus of the invention comprises a projection optical system as showing in FIG. 2.

Figure 1:
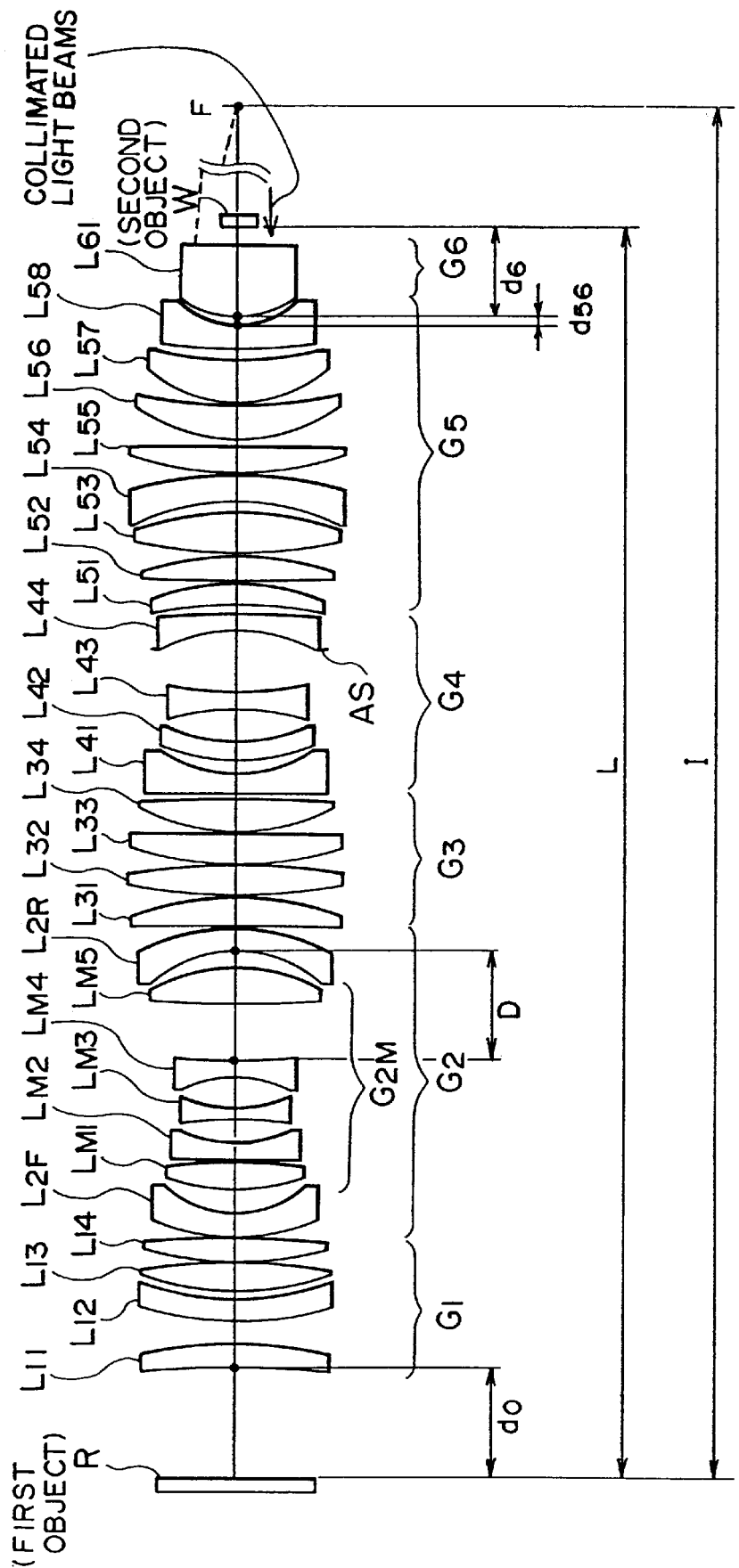
FIG. 1 is drawing to show parameters defined in embodiments of the present invention.
Figure 2:
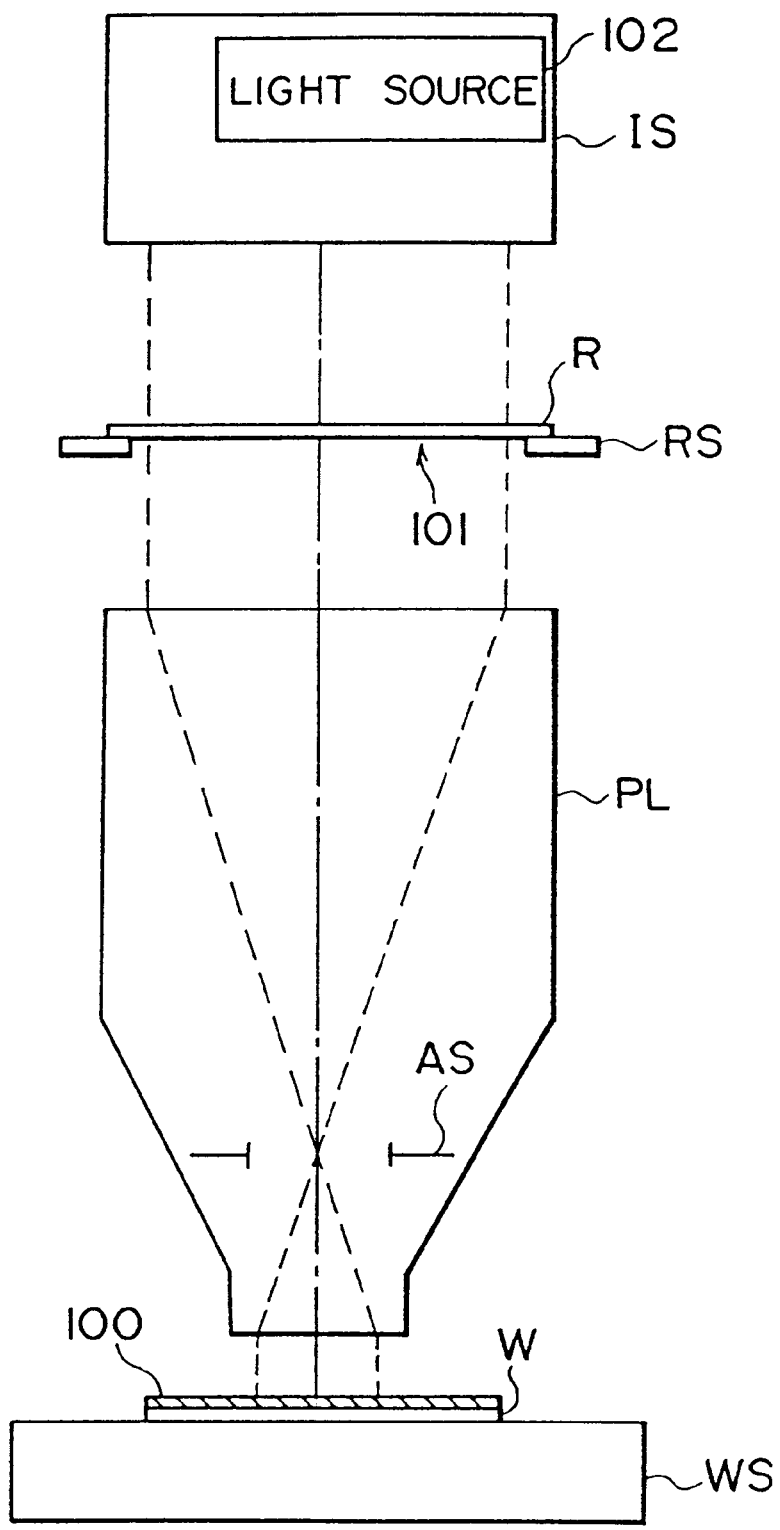
FIG. 2 is a drawing to show schematic structure of an exposure apparatus according to the present invention.

First, briefly describing FIG. 2, a reticle R (first object) is placed as a mask on which a predetermined circuit pattern 101 is formed, on the object plane of a projection optical system PL and a wafer W (second object) as a photosensitive substrate on the image plane of the projection optical system PL, as shown. The reticle R is held on a reticle stage RS while the wafer W on a wafer stage WS. The photosensitive substrate comprises the wafer W and a photosensitive layer 100 made of a material as a photoresistor. Further, an illumination optical system IS, which has a light source 102 for emitting exposure light of a predetermined wavelength, for uniformly illuminating the reticle R is set above the reticle R.

In the above arrangement, light supplied from the illumination optical system IS illuminates the reticle R to form an image of a light source in the illumination optical apparatus IS at the pupil position (or a position of aperture stop AS) of the projection optical system PL, thus achieving the so-called Köhler illumination. Then, through the projection optical system PL, a pattern image of the thus Köhler-illuminated reticle R is projected (or transferred) onto the wafer W through the photosensitive layer 100 by the projection optical system PL. The techniques relating to an exposure apparatus of the present invention are described for example in U.S. Pat. No. 5,194,893, U.S. Pat. No. 5,097,291 and U.S. Pat. No. 5,245,384 and U.S. patent application Ser. No. 299,305, U.S. patent application Ser. No. 255,927 and U.S. patent application Ser. No. 226,327.

The present embodiment shows an example of projection optical system where the light source 102 inside the illumination optical system IS is an excimer laser supplying light with exposure wavelength λ of 248.4 nm, and FIG. 3 to FIG. 8 are lens makeup diagrams of projection optical systems in the first to sixth embodiments according to the present invention.

As shown in FIG. 3 to FIG. 8, a projection optical system in each embodiment has a first lens group $G_1$ with positive refracting power, a second lens group $G_2$ with negative refracting power, a third lens group $G_3$ with positive refracting power, a fourth lens group $G_4$ with negative refracting power, a fifth lens group $G_5$ with positive refracting power, and a sixth lens group $G_6$ with positive refracting power in the named order from the side of reticle R as the first object, which is approximately telecentric on the object side (or on the reticle R side) and on the image side (or on the wafer W side) and which has a reduction magnification.

The projection optical systems of the respective embodiments shown in FIG. 3 to FIG. 8 are arranged so that the object-image distance (a distance from the object plane to the image plane or a distance from the reticle R to the wafer W) L is 1200, the image-side numerical aperture NA is 0.55, the projection magnification B is 5:1, and the diameter of the exposure area on the wafer W is 31.2. In the explanation of embodiments of the present invention, the image plane means a main surface of the wafer W, and the object plane means a surface of the reticle R.

Figure 3:
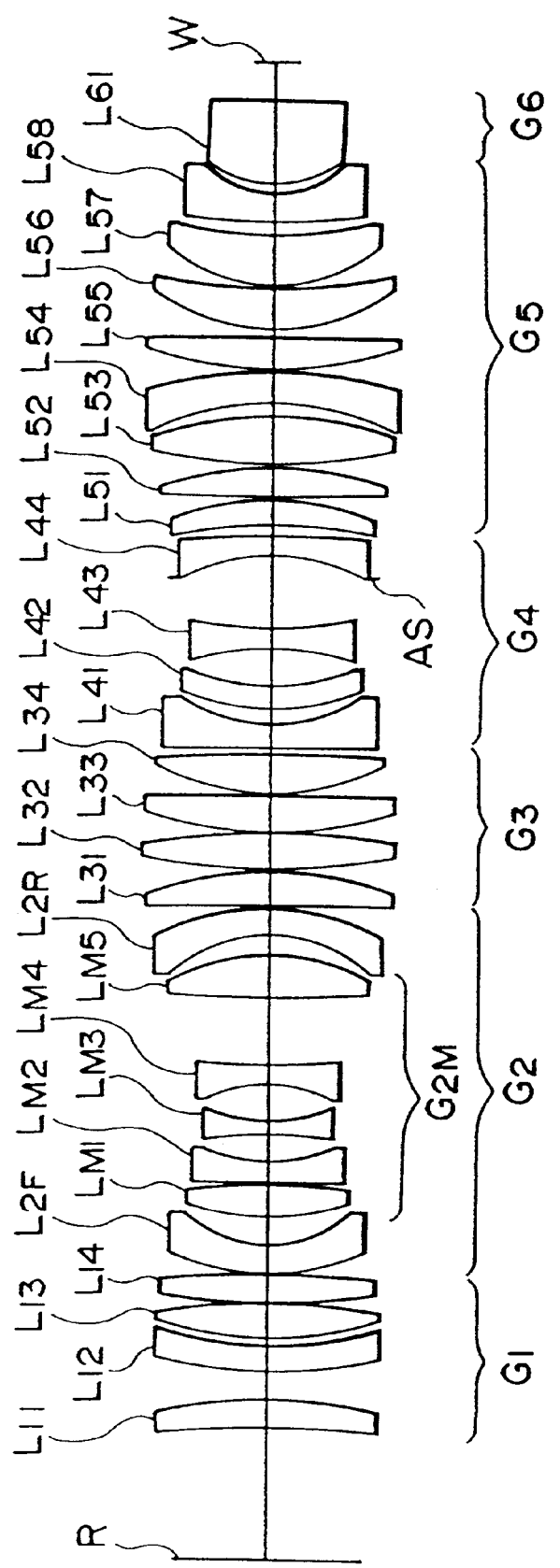
FIG. 3 is a lens makeup diagram in the first embodiment according to the present invention.

The lens makeup of the first embodiment, as shown in FIG. 3, is specifically described. The first lens group $G_1$ has a positive lens $L_{11}$ with a convex surface to the image (positive meniscus lens), a negative lens $L_{12}$ of a meniscus shape with a convex surface to the object, and two positive lenses ($L_{13}$, $L_{14}$) of a double-convex shape in the named order from the object side.

Next, the second lens group $G_2$ is composed of a negative meniscus lens (front lens) $L_{2F}$ placed as closest to the object with a concave surface to the image, a negative meniscus lens (rear lens) $L_{2R}$ placed closest to the image with a concave surface to the object, and an intermediate lens group $G_{2M}$ placed between the negative meniscus lens $L_{2F}$ located closest to the object in the second lens group $G_2$ and the negative meniscus lens $L_{2R}$ located closest to the image in the second lens group $G_2$, and having negative refracting power.

The intermediate lens group $G_{2M}$ is composed of a positive lens (first lens) $L_{M1}$ of a double-convex shape, a negative lens (second lens) $L_{M2}$ with a surface of a greater curvature to the image, a negative lens (third lens) $L_{M3}$ of a double-concave shape, a negative lens (fourth lens) $L_{M4}$ with a surface of a greater curvature to the object, and a positive lens (fifth lens) $L_{M5}$ with a surface of a greater curvature to the image in the named order from the object side.

Further, the third lens group $G_3$ is composed of a positive lens (positive meniscus lens) $L_{31}$ with a surface of a greater curvature to the image, a positive lens $L_{32}$ of a double-convex shape, a positive lens (a positive lens of a double-convex shape) $L_{33}$ with a convex surface to the object, and a positive lens $L_{34}$ with a surface of a greater curvature to the object, and the fourth lens group $G_4$ is composed of a negative lens (negative meniscus lens) $L_{41}$ with a concave surface to the image, a negative meniscus lens $L_{42}$ with a concave surface to the image, a negative lens $L_{43}$ of a double concave surface, and a negative meniscus lens $L_{44}$ with a concave surface to the object.

Here, an aperture stop AS is set in an optical path between the image-side concave surface of the negative lens $L_{41}$ in the fourth lens group $G_4$ and the object-side concave surface of the negative meniscus lens $L_{44}$.

The fifth lens group $G_5$ is composed of a positive meniscus lens $L_{51}$ with a convex surface to the image, a positive lens with a surface of a greater curvature to the image (a positive lens of a double-convex shape) $L_{52}$, a positive lens $L_{53}$ of a double-convex shape, a negative meniscus lens $L_{54}$ with a concave surface to the object, a positive lens $L_{55}$ with a surface of a greater curvature to the object, a positive meniscus lens $L_{56}$ with a convex surface to the object, a positive lens with a surface of a greater curvature to the object (positive meniscus lens) $L_{57}$, and a negative lens with a concave surface to the image (negative meniscus lens) $L_{58}$, and the sixth lens group $G_6$ is composed only of a thick-wall positive lens $L_{61}$ with a convex surface to the object.

Here, because the first lens group $G_1$ in the first embodiment is so arranged that the image-side lens surface of the negative lens $L_{12}$ of the meniscus shape with its convex surface to the object and the object-side lens surface of the positive lens $L_{13}$ of double-convex shape have nearly equal curvatures and are arranged as relatively close to each other, these two lens surfaces correct the higher-order distortions.

In the present embodiment, because the front lens $L_{2F}$ with negative refracting power, placed closest to the object in the second lens group $G_2$, is of the meniscus shape with a concave surface to the image, the generation of coma can be reduced; because the first lens $L_{M1}$ with positive refracting power in the second lens group $G_{2M}$ is of the double-convex shape with a convex surface to the image and another convex surface to the object, the generation of spherical aberration of the pupil can be suppressed. Further, because the fifth lens $L_{M5}$ with positive refracting power in the intermediate lens group $G_{2M}$ has the convex surface opposed to the concave surface of the rear lens $L_{2R}$ with negative refracting power placed on the image side thereof, the astigmatism can be corrected.

Since the fourth lens group $G_4$ is so arranged that the negative lens $L_{41}$ with its concave surface to the image is placed on the object side of the negative lens (negative lens of double-concave shape) $L_{43}$ and that the negative meniscus lens $L_{44}$ with its concave surface to the object is placed on the image side of the negative lens (negative lens of double-concave shape) $L_{43}$, the Petzval sum can be corrected while suppressing the generation of coma.

The present embodiment is so arranged that the aperture stop AS is placed between the image-side concave surface of the negative lens $L_{41}$ and the object-side concave surface of the negative meniscus lens $L_{44}$ in the fourth lens group $G_4$ whereby the lens groups of from the third lens group $G_3$ to the sixth lens group $G_6$ can be arranged on either side of the aperture stop AS with some reduction magnification and without destroying the symmetry so much, which can suppress generation of asymmetric aberrations, specifically generation of coma or distortion.

Since the positive lens $L_{53}$ in the fifth lens group $G_5$ is of the double-convex shape where its convex surface is opposed to the negative meniscus lens $L_{54}$ and the other lens surface opposite to the negative meniscus lens $L_{54}$ is also a convex surface, the generation of higher-order spherical aberrations with an increase in NA can be suppressed.

Figure 4:
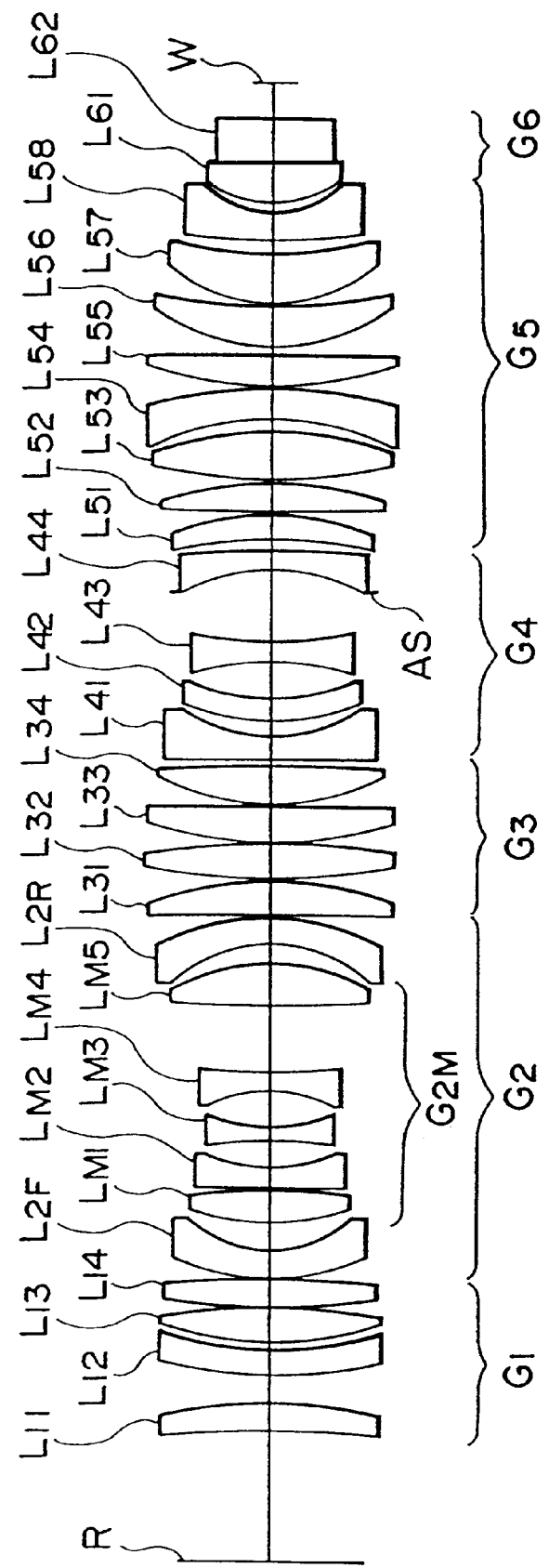
FIG. 4 is a lens makeup diagram in the second embodiment according to the present invention.

The specific lens makeup of the projection optical system in the second embodiment as shown in FIG. 4 is similar to that of the first embodiment shown in FIG. 3 and described above but different in that the fourth lens group $G_4$ is composed of a negative lens with a concave surface to the image (negative lens of a plano-concave shape) $L_{41}$, a negative meniscus lens $L_{42}$ with a concave surface to the image, a negative lens $L_{43}$ of a double-concave shape, and a negative meniscus lens $L_{44}$ with a concave surface to the object and in that the sixth lens group $G_6$ is composed of a positive lens with a convex surface to the object (positive meniscus lens) $L_{61}$, and a positive lens with a convex surface to the object (positive meniscus lens) $L_{62}$.

Also in the second embodiment, the image-side lens surface of the negative meniscus lens $L_{12}$ with its convex surface to the object and the object-side lens surface of the positive lens $L_{13}$ of double-convex shape correct the higher-order distortions, similarly as in the above first embodiment. Further, the sixth lens group $G_6$ is preferably composed of a less number of constituent lenses in order to suppress a distortion generated by the sixth lens group $G_6$, but if it is difficult to produce a thick lens the sixth lens group $G_6$ may be composed of two lenses as in the present embodiment. As for the other lens groups (the second lens group $G_1$ to the fifth lens group $G_5$) in the second embodiment, the same functions as in the first embodiment are achieved thereby.

Figure 5:
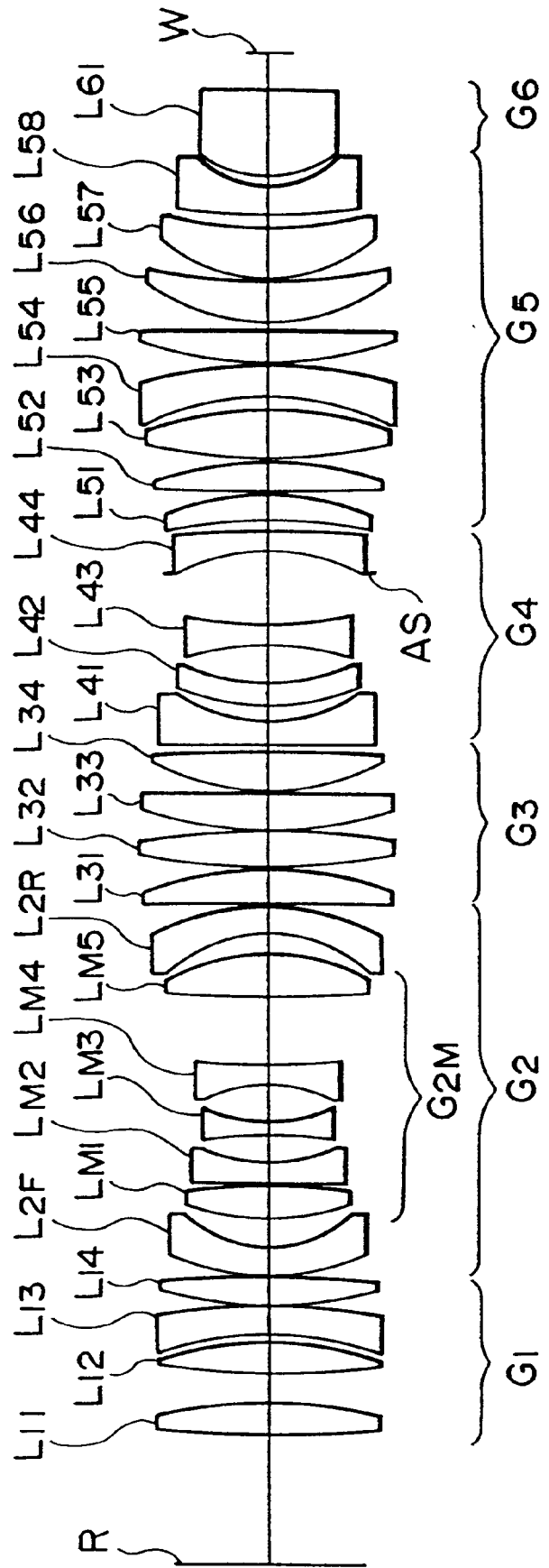
FIG. 5 is a lens makeup diagram in the third embodiment according to the present invention.

The specific lens makeup of the projection optical system of the third embodiment as shown in FIG. 5 is similar to that of the first embodiment shown in FIG. 3 and described previously, but different in that the first lens group $G_1$ is composed of a positive lens with a convex surface to the image (positive lens of double-convex shape) $L_{11}$, a positive lens with a convex surface to the image (positive lens of double-convex shape) $L_{12}$, a negative meniscus lens $L_{13}$ with a concave surface to the object, and a positive lens $L_{14}$ of double-convex shape in the named order from the object side and in that the third lens group $G_3$ is composed of a positive lens with a surface of a greater curvature to the image (positive meniscus lens) $L_{31}$, a positive lens $L_{32}$ of double-convex shape, a positive lens with a surface of a greater curvature to the object (positive lens of double-convex shape) $L_{33}$, and a positive lens with a convex surface to the object (positive meniscus lens) $L_{34}$.

In the third embodiment, the image-side lens surface of the positive lens $L_{12}$ with its convex surface to the image and the object-side lens surface of the negative meniscus lens $L_{13}$ with its concave surface to the object correct the higher-order distortions. As for the other lens groups (the second lens group $G_2$, and the fourth lens group $G_4$ to the sixth lens group $G_6$) in the third embodiment, the same functions as in the first embodiment are achieved thereby.

Figure 6:
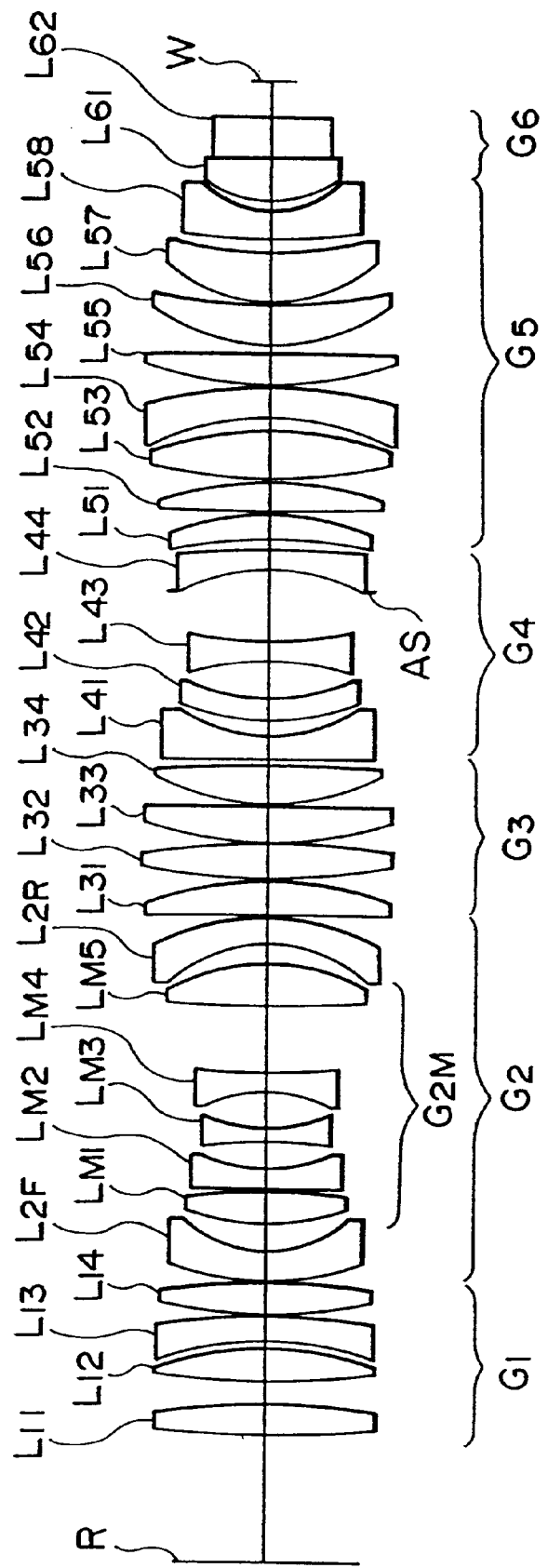
FIG. 6 is a lens makeup diagram in the fourth embodiment according to the present invention.

The specific lens makeup of the projection optical system of the fourth embodiment as shown in FIG. 6 is similar to that of the third embodiment shown in FIG. 5 and described above, but different in that the third lens group $G_3$ is composed of a positive lens with a surface of a greater curvature to the image side (positive meniscus lens) $L_{31}$, a positive lens $L_{32}$ of double-convex shape, a positive lens with a convex surface to the object (positive lens of double-convex shape) $L_{33}$, and a positive lens with a surface of a greater curvature to the object (positive lens of double-convex shape) $L_{34}$ and in that the fourth lens group $G_4$ is composed of a negative lens with a concave surface to the image (negative lens of double-concave shape) $L_{41}$, a negative meniscus lens $L_{42}$ with a concave surface to the image, a negative lens $L_{43}$ of double-concave shape, and a negative meniscus lens $L_{44}$ with a concave surface to the object. The present embodiment is also different in that the sixth lens group $G_6$ is composed of a positive lens with a convex surface to the object (positive meniscus lens) $L_{61}$ and a positive lens with a convex surface to the object (positive meniscus lens) $L_{62}$.

The first lens group $G_1$ in the fourth embodiment achieves the same functions as in the third embodiment described previously, the second lens group $G_2$ to the fifth lens group $G_5$ do the same functions as in the first embodiment, and the sixth lens group $G_6$ does the same functions as in the second embodiment.

Figure 7:
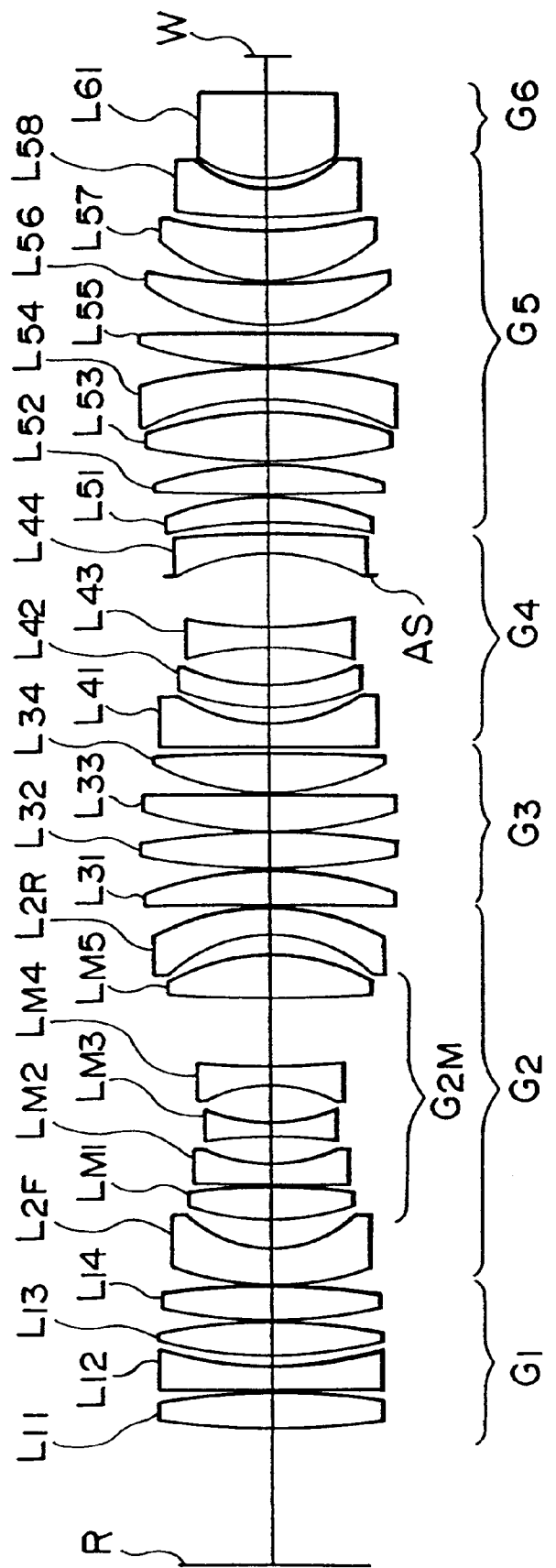
FIG. 7 is a lens makeup diagram in the fifth embodiment according to the present invention.

The specific lens makeup of the projection optical system of the fifth embodiment shown in FIG. 7 is similar to that of the first embodiment shown in FIG. 3 and described previously, but different in that the first lens group $G_1$ is composed of a positive lens with a convex surface to the image (positive lens of double-convex shape) $L_{11}$, a negative lens with a concave surface to the image (negative lens of double-concave shape) $L_{12}$ and two positive lenses ($L_{13}$, $L_{14}$) of double-convex shape in the named order from the object side. It is also different in that the third lens group $G_3$ is composed of a positive lens with a surface of a greater curvature to the image (positive meniscus lens) $L_{31}$, a positive lens $L_{32}$ of double-convex shape, a positive lens with a convex surface to the object (positive meniscus lens) $L_{33}$, and a positive lens with a surface of a greater curvature to the object (positive lens of double-convex shape) $L_{34}$. It is also different from the lens makeup of the first embodiment in that the fourth lens group $G_4$ is composed of a negative lens with a concave surface to the image (negative lens of double-concave shape) $L_{41}$, a negative meniscus lens $L_{42}$ with a concave surface to the image, a negative lens $L_{43}$ of double-concave shape, and a negative meniscus lens $L_{44}$ with a concave surface to the object. It is further different in that the fifth lens group $G_5$ is composed of a positive meniscus lens $L_{51}$ with a convex surface to the image, a positive lens with a surface of a greater curvature to the image (positive meniscus lens) $L_{52}$, a positive lens $L_{53}$ of double-convex shape, a negative meniscus lens $L_{54}$ with a concave surface to the object, a positive lens with a surface of a greater curvature to the object (positive meniscus lens) $L_{55}$, a positive meniscus lens $L_{56}$ with a convex surface to the object, a positive lens with a surface of a greater curvature to the object (positive meniscus lens) $L_{57}$, and a negative lens with a concave surface to the image (negative meniscus lens) $L_{58}$.

In the fifth embodiment the higher-order distortions are corrected by a pair of the image-side convex surface of the positive lens $L_{11}$ and the object-side concave surface of the negative lens $L_{12}$ and a pair of the image-side concave surface of the negative lens $L_{12}$ and the object-side convex surface of the positive lens $L_{13}$. As for the other lens groups (the second to the fifth lens groups $G_2$ to $G_5$) in the fifth embodiment, the same functions as in the first embodiment are achieved thereby.

Figure 8:
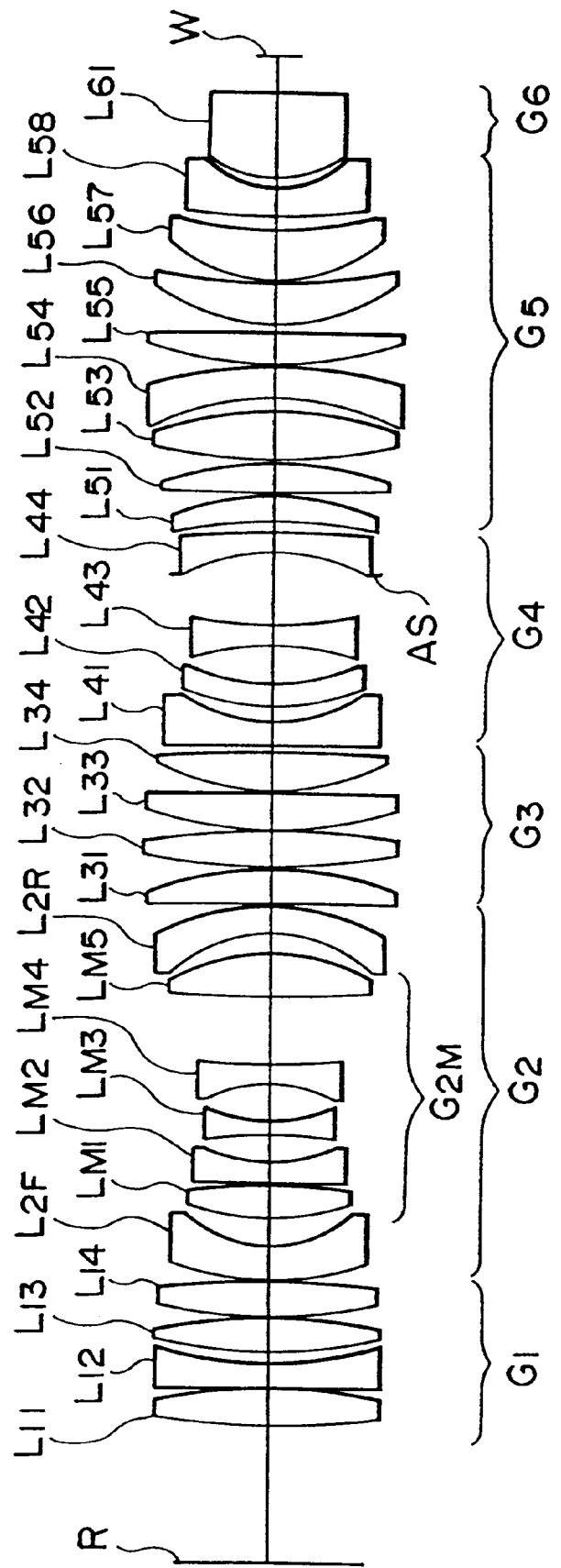
FIG. 8 is a lens makeup diagram in the sixth embodiment according to the present invention.
Figure 9:
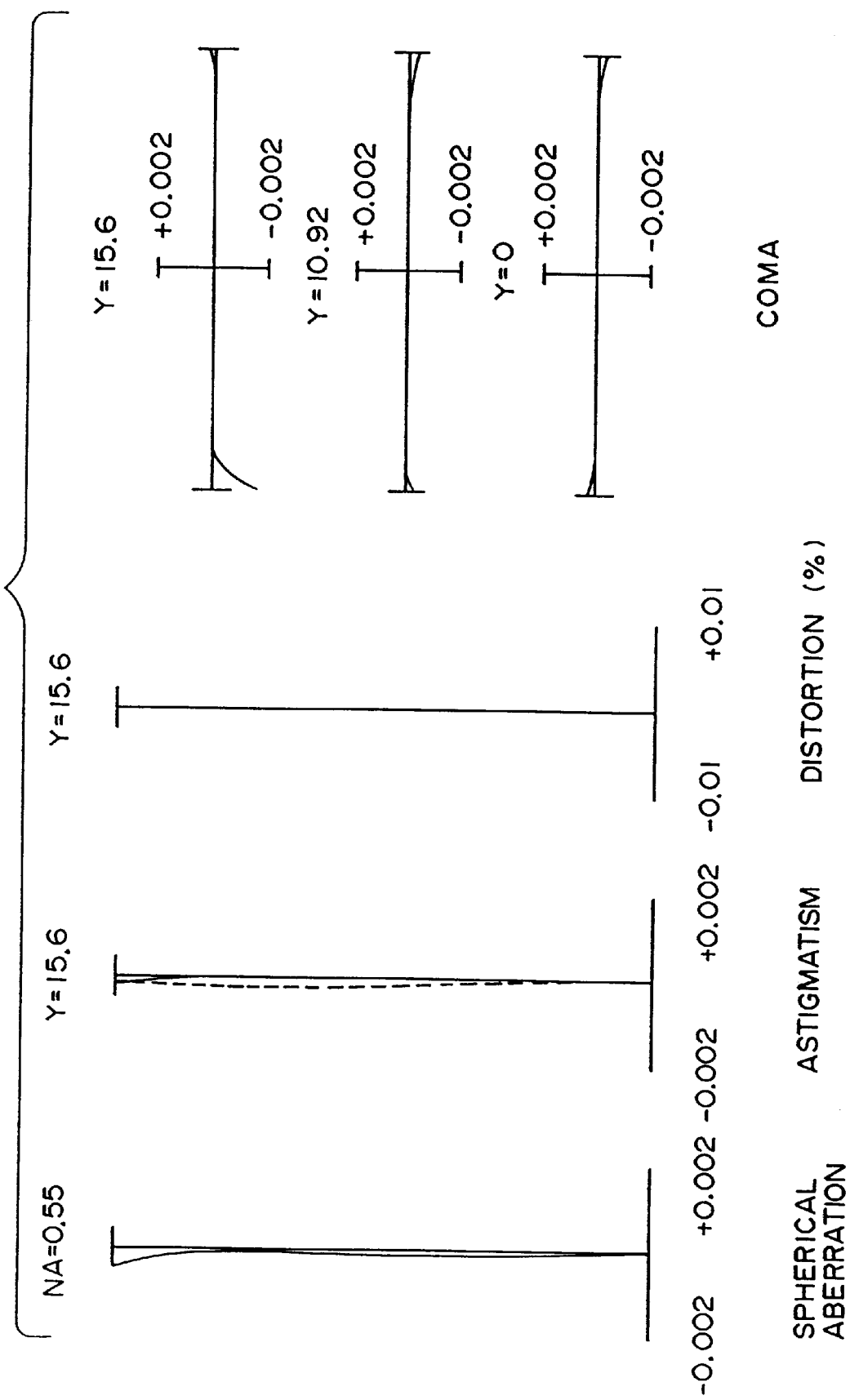
FIG. 9 is various aberration diagrams in the first embodiment according to the present invention.
Figure 10:
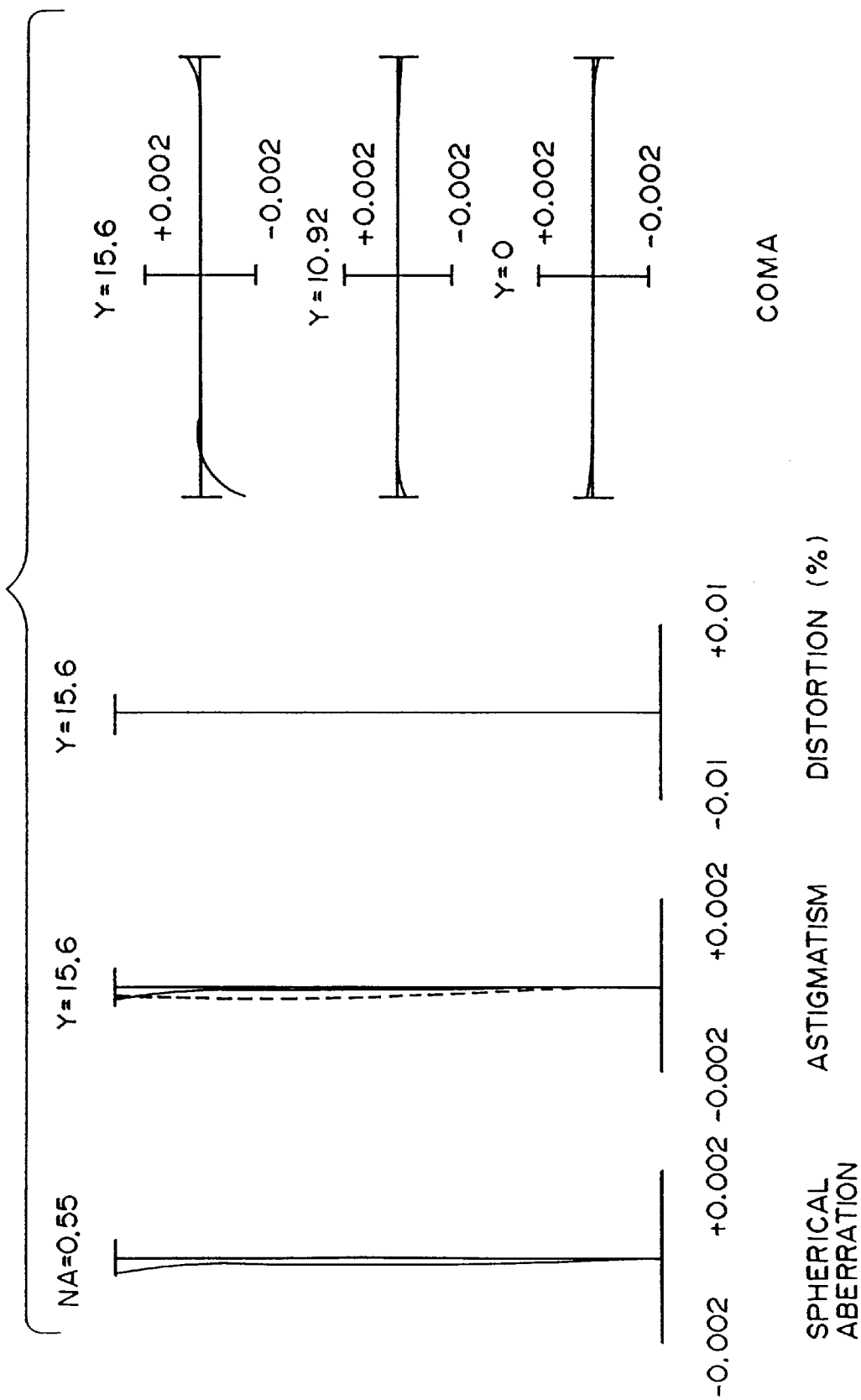
FIG. 10 is various aberration diagrams in the second embodiment according to the present invention.
Figure 11:
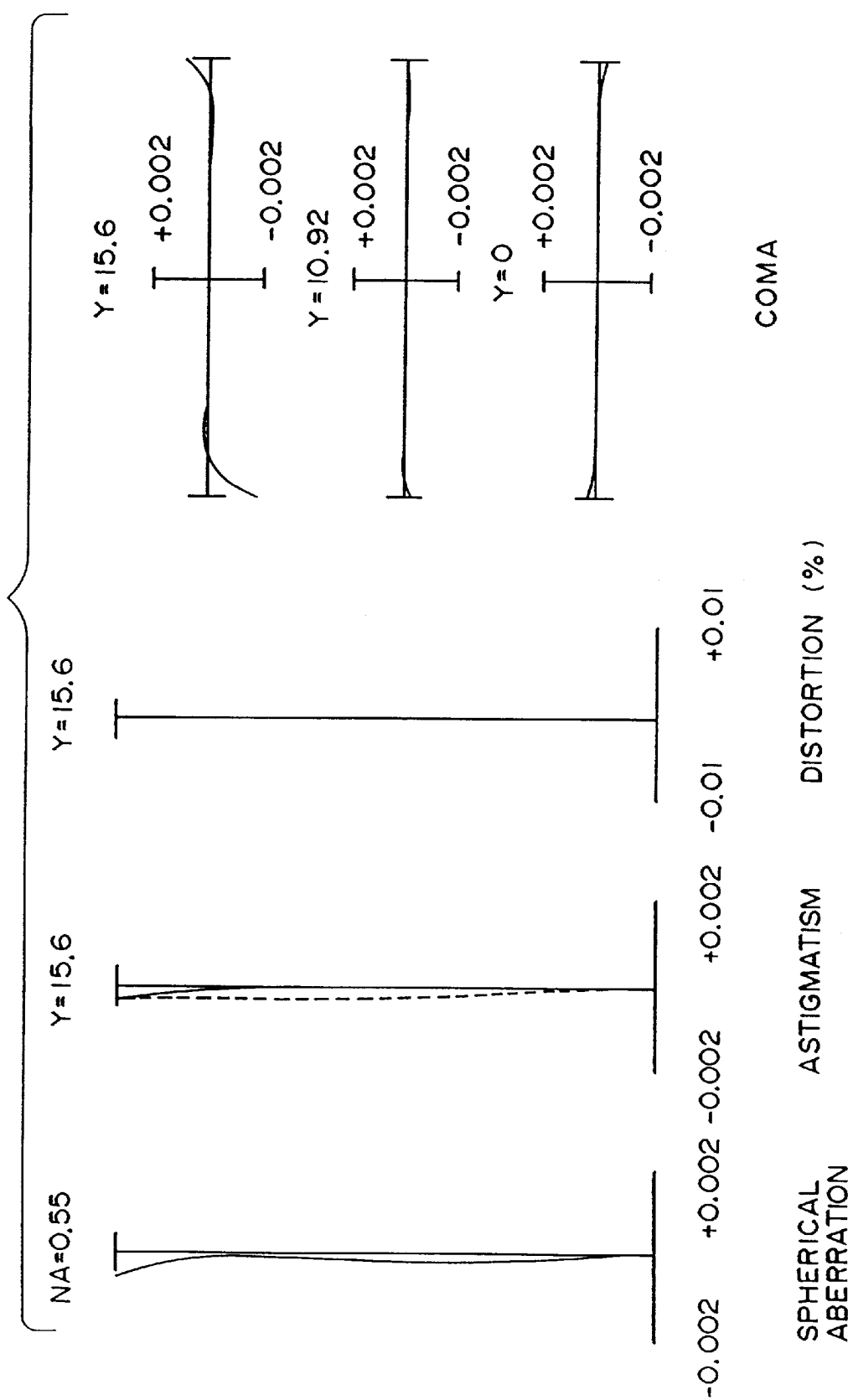
FIG. 11 is various aberration diagrams in the third embodiment according to the present invention.
Figure 12:
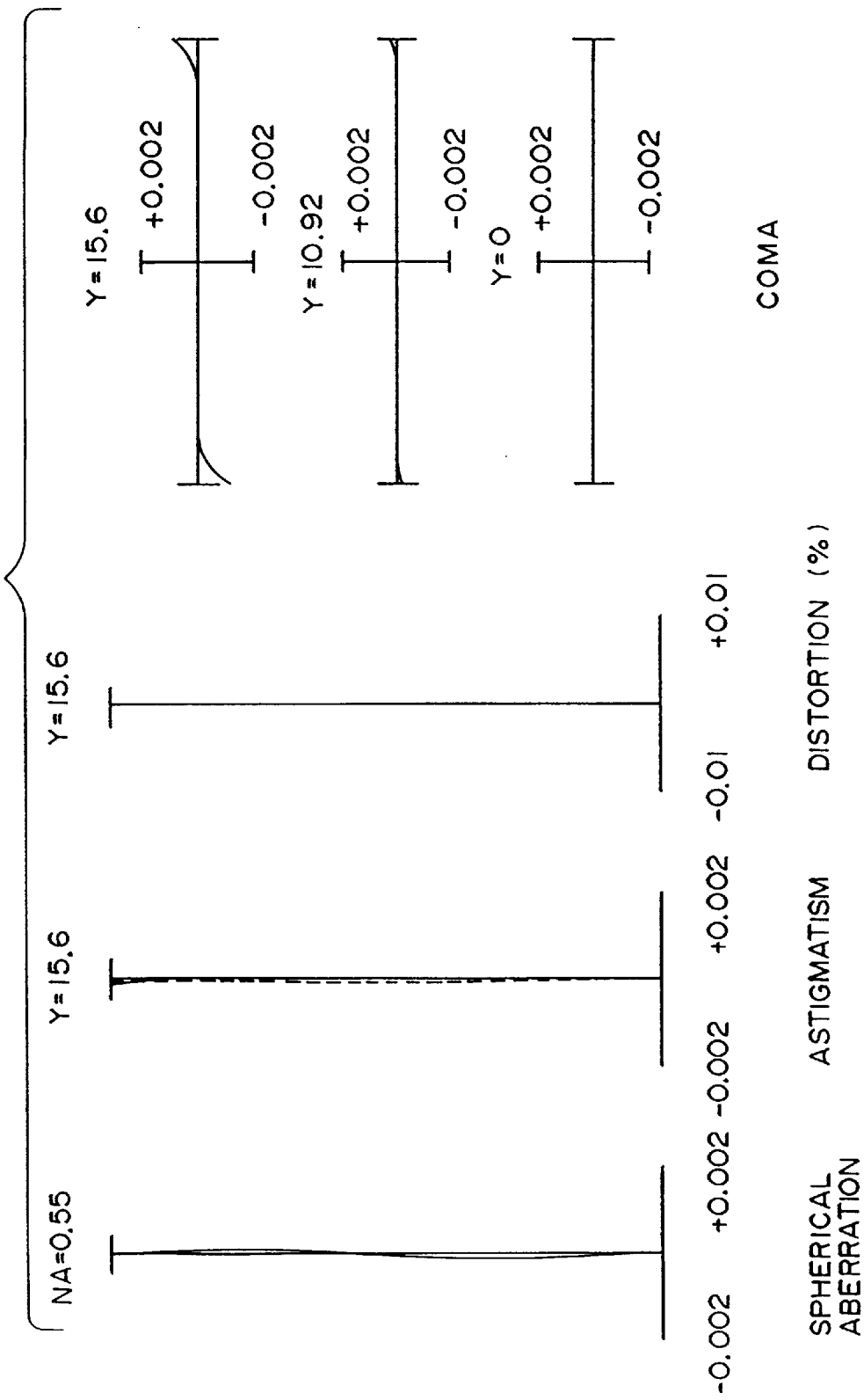
FIG. 12 is various aberration diagrams in the fourth embodiment according to the present invention.
Figure 13:
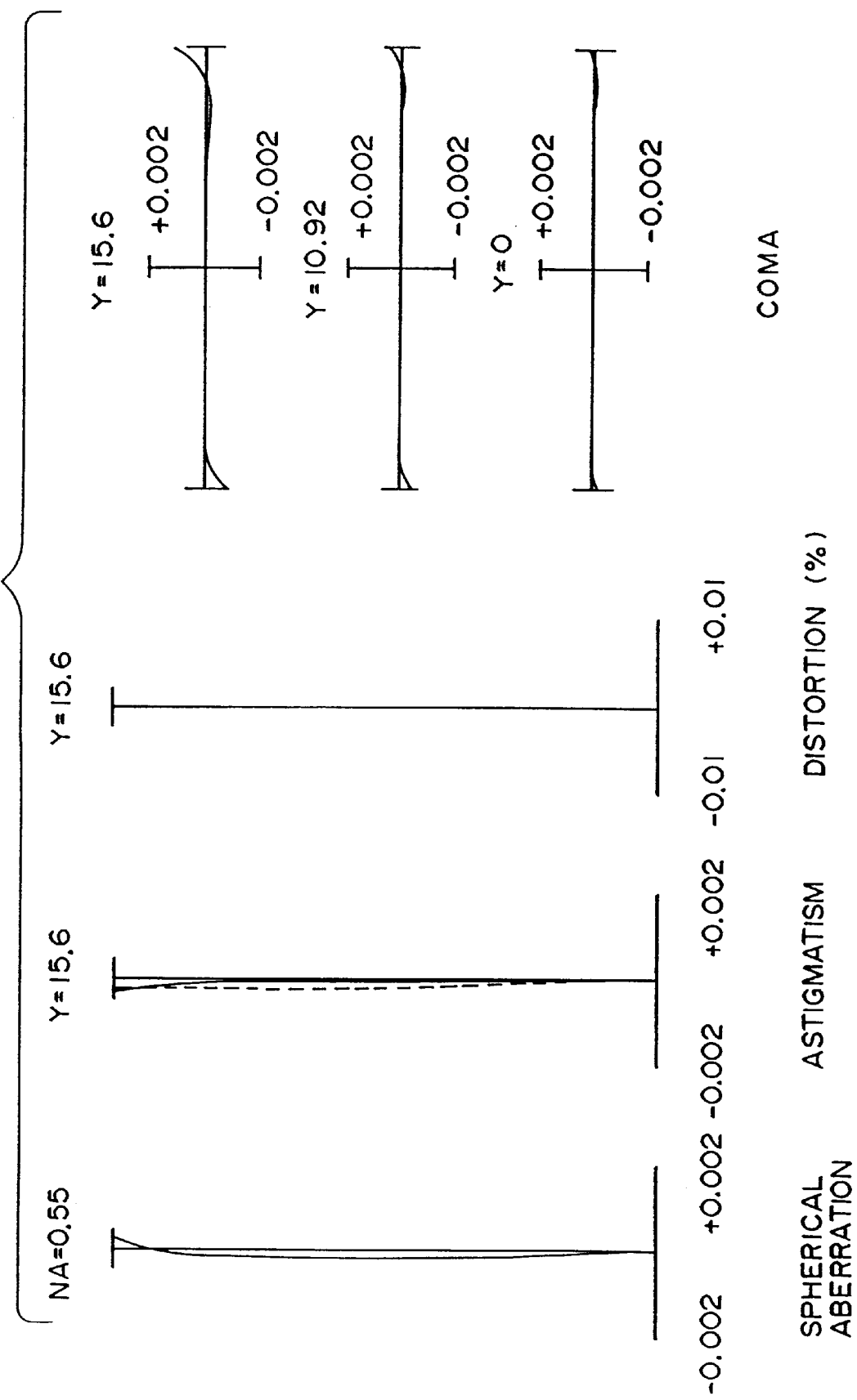
FIG. 13 is various aberration diagrams in the fifth embodiment according to the present invention.

The sixth embodiment shown in FIG. 8 has the same lens makeup as that of the fifth embodiment as described above, and achieves the substantially same functions as in the fifth embodiment.

Now, Table 1 to Table 12 listed below indicate values of specifications and numerical values corresponding to the conditions in the respective embodiments according to the present invention.

In the tables, left end numerals represent lens surfaces located in the named order from the object side (reticle side), r curvature radii of lens surfaces, d lens surface separations, n refractive indices of synthetic quartz $SiO_2$ for the exposure wavelength $\lambda$ of 248.4 nm, d0 a distance from the first object (reticle) to the lens surface (first lens surface) closest to the object (reticle) in the first lens group $G_1$, Bf a distance from the lens surface closest to the image (wafer) in the sixth lens group $G_6$ to the image plane (wafer surface), B a projection magnification of the projection optical system, NA the image-side numerical aperture of the projection optical system, L the object-image distance from the object plane (reticle surface) to the image plane (wafer surface), I the axial distance from the first object (reticle) to the first-object-side focal point of the entire projection optical system (where the first-object-side focal point of the entire projection optical system means an intersecting point of exit light with the optical axis after collimated light beams in the paraxial region with respect to the optical axis of the projection optical system are let to enter the projection optical system on the second object side and when the light beams in the paraxial region are outgoing from the projection optical system), $f_1$ the focal length of the first lens group $G_1$, $f_2$ the focal length of the second lens group $G_2$, $f_3$ the focal length of the third lens group $G_3$, $f_4$ the focal length of the fourth lens group $G_4$, $f_5$ the focal length of the fifth lens group $G_5$, $f_6$ the focal length of the sixth lens group $G_6$, $f_n$ the overall focal length of from the second lens to the fourth lens, $f_{2F}$ the focal length of the front lens placed closest to the first object in the second lens group and having negative refracting power with its concave surface to the second object, $f_{2R}$ the focal length of the rear lens placed closest to the second object in the second lens group and having negative refracting power with its concave surface to the first object, $f_{21}$ the focal length of the first lens with positive refracting power in the intermediate lens group in the second lens group, $f_{22}$ the focal length of the second lens with negative refracting power in the second lens group, $f_{23}$ the focal length of the third lens with negative refracting power in the second lens group, $f_{24}$ the focal length of the fourth lens with negative refracting power in the second lens group, $\Phi_{21}$ the refracting power of the second-object-side lens surface of the first lens with positive refracting power in the intermediate lens group $G_{21}$ in the second lens group, D the axial distance from the second-object-side lens surface of the fourth lens in the intermediate lens group in the second lens group to the first-object-side lens surface of the rear lens in the second lens group, $r_{5n}$ the curvature radius of the concave surface in the negative meniscus lens in the fifth lens group, $r_{5p}$ the curvature radius of the convex surface opposed to the concave surface of the negative meniscus lens, in the positive lens placed adjacent to the concave surface of the negative meniscus lens in the fifth lens group, $r_{4F}$ the first-object-side curvature radius in the rear lens placed closest to the second object in the fourth lens group, $r_{4R}$ the second-object-side curvature radius in the rear lens placed closest to the second object in the fourth lens group, $r_{5F}$ the first-object-side curvature radius in the second lens placed closest to the second object in the fifth lens group, $r_{5R}$ the second-object-side curvature radius of the negative lens placed closest to the second object in the fifth lens group, $r_{6F}$ the first-object-side curvature radius of the lens placed closest to the first object in the sixth lens group, $d_{56}$ the lens group separation between the fifth lens group and the sixth lens group, $d_6$ the axial distance from the lens surface closest to the first object in the sixth lens group to the second object, and $\phi$ the refracting power of the lens surface of the lens or lenses forming the sixth lens group.

TABLE 1

First Embodiment $d_0$ = 105.33208
B = 1/5
NA = 0.55
Bf = 28.62263
L = 1200

| | r | d | n |
|---|---|---|---|
| 1 | −821.91920 | 23.00000 | 1.50839 |
| 2 | −391.93385 | 20.81278 | |
| 3 | 334.30413 | 20.00000 | 1.50839 |
| 4 | 239.01947 | 7.92536 | |
| 5 | 267.66514 | 28.00000 | 1.50839 |
| 6 | −618.41676 | 1.04750 | |
| 7 | 337.90351 | 23.00000 | 1.50839 |

TABLE 1-continued

First Embodiment $d_0 = 105.33208$
$B = 1/5$
$NA = 0.55$
$Bf = 28.62263$
$L = 1200$

| | r | d | n |
|---|---|---|---|
| 8 | −1279.67000 | 0.97572 | |
| 9 | 200.03116 | 24.00000 | 1.50839 |
| 10 | 105.22457 | 22.04713 | |
| 11 | 219.65515 | 26.00000 | 1.50839 |
| 12 | −546.12474 | 1.10686 | |
| 13 | 4788.40002 | 17.00000 | 1.50839 |
| 14 | 125.70412 | 20.76700 | |
| 15 | −381.52610 | 12.90000 | 1.50839 |
| 16 | 134.36400 | 26.88549 | |
| 17 | −127.38724 | 15.00000 | 1.50839 |
| 18 | 433.13808 | 52.33906 | |
| 19 | 1260.83000 | 35.00000 | 1.50839 |
| 20 | −178.61526 | 14.91509 | |
| 21 | −129.71674 | 22.80000 | 1.50839 |
| 22 | −202.88016 | 2.79782 | |
| 23 | −4128.12000 | 27.00000 | 1.50839 |
| 24 | −299.28737 | 2.87255 | |
| 25 | 556.52963 | 28.00000 | 1.50839 |
| 26 | −928.16848 | 2.49780 | |
| 27 | 367.82207 | 30.00000 | 1.50839 |
| 28 | −4438.51001 | 1.64701 | |
| 29 | 220.29374 | 31.00000 | 1.50839 |
| 30 | −1698.69000 | 3.60527 | |
| 31 | 4987.07001 | 21.00000 | 1.50839 |
| 32 | 146.02635 | 11.76890 | |
| 33 | 216.75649 | 17.00000 | 1.50839 |
| 34 | 161.01290 | 31.54706 | |
| 35 | −206.90673 | 15.90000 | 1.50839 |
| 36 | 309.12541 | 56.09046 | |
| 37 | −183.11187 | 18.00000 | 1.50839 |
| 38 | −894.17440 | 6.28784 | |
| 39 | −409.02115 | 23.00000 | 1.50839 |
| 40 | −215.49999 | 1.14438 | |
| 41 | 3139.57999 | 23.00000 | 1.50839 |
| 42 | −320.84882 | 2.92283 | |
| 43 | 445.47649 | 38.00000 | 1.50839 |
| 44 | −348.37380 | 11.43498 | |
| 45 | −229.01731 | 27.00000 | 1.50839 |
| 46 | −352.88961 | 1.10071 | |
| 47 | 370.91242 | 25.00000 | 1.50839 |
| 48 | −3446.41000 | 4.83032 | |
| 49 | 178.35450 | 32.00000 | 1.50839 |
| 50 | 471.60399 | 3.29194 | |
| 51 | 137.85195 | 39.90000 | 1.50839 |
| 52 | 331.09797 | 9.82671 | |
| 53 | 520.77561 | 23.0d000 | 1.50839 |
| 54 | 80.26937 | 7.04896 | |
| 55 | 90.74309 | 71.00000 | 1.50839 |
| 56 | 1836.49001 | | |

TABLE 2

Values corresponding to the Conditions in the First Embodiment (1) $f_1/f_3 = 1.47$
(2) $f_2/f_4 = 1.31$
(3) $f_5/L = 0.0988$
(4) $f_6/L = 0.154$
(5) $f_n/>f_2 = 0.589$
(6) $I/L = 2.33$
(7) $f_{24}/f_{23} = 0.990$
(8) $f_{22}/f_{23} = 1.31$
(9) $D/L = 0.0852$
(10) $f_4/L = -0.0638$
(11) $f_2/L = -0.0834$
(12) $(r_{5p} - r_{5n})/(r_{5p} + r_{5n}) = 0.207$
(13) $(r_{4F} - r_{4R})/(r_{4F} + r_{4R}) = -0.660$ TABLE 2-continued Values corresponding to the Conditions in the First Embodiment

(14) $(r_{5R} - r_{6F})/(r_{5R} + r_{6F}) = -0.0613$
(15) $d_{56}/L = 0.00587$
(16) $d_6/r_{6F} = 1.10$
(17) $(r_{5F} - r_{5R})/(r_{5F} + r_{5R}) = 0.733$
(18) $1/(\phi_{21} \cdot L) = 0.895$
(19) $f_{21}/L = 0.260$
(20) $f_{2F}/f_{2R} = 0.604$

TABLE 3

Second Embodiment $d_0 = 103.54346$
$B = 1/5$
$NA = 0.55$
$Bf = 29.06029$
$L = 1200$

| | r | d | n |
|---|---|---|---|
| 1 | −2191.4599 | 23.00000 | 1.50839 |
| 2 | −443.19378 | 18.81278 | |
| 3 | 372.47246 | 20.00000 | 1.50839 |
| 4 | 259.89086 | 7.92536 | |
| 5 | 296.05557 | 26.00000 | 150839 |
| 6 | −527.24081 | 1.04750 | |
| 7 | 478.04893 | 27.00000 | 1.50839 |
| 8 | −948.34609 | 0.97572 | |
| 9 | 210.20717 | 24.00000 | 1.50839 |
| 10 | 107.85292 | 24.04713 | |
| 11 | 214.18600 | 26.00000 | 1.50839 |
| 12 | −438.52759 | 1.10686 | |
| 13 | −1434.49001 | 17.00000 | 1.50839 |
| 14 | 132.17373 | 18.76700 | |
| 15 | −370.22109 | 12.90000 | 1.50839 |
| 16 | 137.36441 | 26.88549 | |
| 17 | −131.18161 | 15.00000 | 1.50839 |
| 18 | 450.35044 | 53.03407 | |
| 19 | 1459.21001 | 35.00000 | 1.50839 |
| 20 | −182.99101 | 14.91509 | |
| 21 | −132.88561 | 22.80000 | 1.50839 |
| 22 | −199.28914 | 2.79782 | |
| 23 | −5536.72998 | 27.00000 | 1.50839 |
| 24 | −310.674563 | 2.87255 | |
| 25 | 528.12523 | 28.00000 | 1.50839 |
| 26 | −1200.55000 | 2.49780 | |
| 27 | 320.15215 | 30.00000 | 1.50839 |
| 28 | −2820.19000 | 1.64701 | |
| 29 | 239.46093 | 31.00000 | 1.50839 |
| 30 | −2425.69000 | 5.60527 | |
| 31 | ∞ | 21.00000 | 1.50839 |
| 32 | 148.13116 | 9.76890 | |
| 33 | 207.41773 | 17.00000 | 1.50839 |
| 34 | 155.42831 | 31.54706 | |
| 35 | −218.29971 | 15.90000 | 1.50839 |
| 36 | 304.21175 | 56.74759 | |
| 37 | −175.66635 | 18.00000 | 1.50839 |
| 38 | −1130.86000 | 6.28784 | |
| 39 | −485.73656 | 23.00000 | 1.50839 |
| 40 | −216.43349 | 1.14438 | |
| 41 | 2806.14999 | 23.00000 | 1.50839 |
| 42 | −316.00620 | 2.92283 | |
| 43 | 437.43410 | 38.00000 | 1. 50839 |
| 44 | −355.32964 | 11.43498 | |
| 45 | −235.73758 | 27.00000 | 1.50839 |
| 46 | −360.50104 | 1.10071 | |
| 47 | 410.57953 | 25.00000 | 1.50839 |
| 48 | −3698.22000 | 4.83032 | |
| 49 | 178.15299 | 32.00000 | 1.50839 |
| 50 | 506.53177 | 3.29194 | |
| 51 | 137.46544 | 39.90000 | 1.50839 |
| 52 | 328.51597 | 9.82671 | |
| 53 | 544.32105 | 23.00000 | 1.50839 |
| 54 | 81.70638 | 7.04896 | |
| 55 | 92.81520 | 34.00000 | 1.50839 |

TABLE 3-continued

Second Embodiment $d_0 = 103.54346$
$B = 1/5$
$NA = 0.55$
$Bf = 29.06029$
$L = 1200$

|    | r         | d        | n       |
|----|-----------|----------|---------|
| 56 | 511.57718 | 2.00000  |         |
| 57 | 482.15006 | 35.00000 | 1.50839 |
| 58 | 1631.30000 |         |         |

TABLE 4

Values corresponding to the Conditions in the Second Embodiment (1) $f_1/f_3 = 1.50$
(2) $f_2/f_4 = 1.39$
(3) $f_5/L = 0.0971$
(4) $f_6/L = 0.158$
(5) $f_n/>f_2 = 0.568$
(6) $I/L = 2.21$
(7) $f_{24}/f_{23} = 1.01$
(8) $f_{22}/f_{23} = 1.21$
(9) $D/L = 0.0858$
(10) $f_4/L = -0.0621$
(11) $f_2/L = -0.0861$
(12) $(r_{5p} - r_{5n})/(r_{5p} + r_{5n}) = 0.202$
(13) $(r_{4F} - r_{4R})/(r_{4F} + r_{4R}) = -0.731$
(14) $(r_{5R} - r_{6F})/(r_{5R} + r_{6F}) = -0.0637$
(15) $d_{56}/L = 0.00587$
(16) $d_6/r_{6F} = 1.08$
(17) $(r_{5F} - r_{5R})/(r_{5F} + r_{5R}) = 0.739$
(18) $1/(\phi_{21} \cdot L) = 0.719$
(19) $f_{21}/L = 0.239$
(20) $f_{2F}/f_{2R} = 0.533$

TABLE 5

Third Embodiment $d_0 = 104.69561$
$B = 1/5$
$NA = 0.55$
$Bf = 29.13809$
$L = 1200$

|    | r           | d        | n       |
|----|-------------|----------|---------|
| 1  | -1364.36000 | 23.00000 | 1.50839 |
| 2  | -612.17411  | 20.81278 |         |
| 3  | 699.63988   | 24.00000 | 1.50839 |
| 4  | -301.81026  | 7.92536  |         |
| 5  | -248.00150  | 20.00000 | 1.50839 |
| 6  | -614.52792  | 1.04750  |         |
| 7  | 332.05244   | 27.00000 | 1.50839 |
| 8  | -582.52759  | 0.97572  |         |
| 9  | 232.12759   | 24.00000 | 1.50839 |
| 10 | 110.33434   | 27.04713 |         |
| 11 | 230.79590   | 23.00000 | 1.50839 |
| 12 | -359.85171  | 1.10686  |         |
| 13 | -1275.75999 | 17.00000 | 1.50839 |
| 14 | 127.98361   | 18.76700 |         |
| 15 | -569.83204  | 12.90000 | 1.50839 |
| 16 | 140.20359   | 26.88549 |         |
| 17 | -108.76770  | 15.00000 | 1.50839 |
| 18 | 593.61218   | 51.86789 |         |
| 19 | 2324.85999  | 35.00000 | 1.50839 |
| 20 | -163.53564  | 14.91509 |         |
| 21 | -121.26603  | 22.80000 | 1.50839 |
| 22 | -192.12364  | 2.79782  |         |
| 23 | -4480.40997 | 27.00000 | 1.50839 |
| 24 | -297.83388  | 2.87255  |         |
| 25 | 445.50685   | 28.00000 | 1.50839 |

TABLE 5-continued

Third Embodiment $d_0 = 104.69561$
$B = 1/5$
$NA = 0.55$
$Bf = 29.13809$
$L = 1200$

|    | r          | d        | n        |
|----|------------|----------|----------|
| 26 | -877.28296 | 2.49780  |          |
| 27 | 422.96766  | 27.00000 | 1.50839  |
| 28 | -1570.03000 | 1.64701 |          |
| 29 | 230.95785  | 31.00000 | 1.50839  |
| 30 | 3000.00000 | 8.60527  |          |
| 31 | 1800.00000 | 21.00000 | 1.50839  |
| 32 | 138.38357  | 9.76890  |          |
| 33 | 191.56081  | 17.00000 | 1.50839  |
| 34 | 157.70119  | 31.54706 |          |
| 35 | -217.22866 | 15.90000 | 1.50&39  |
| 36 | 294.71194  | 56.69427 |          |
| 37 | -173.19975 | 18.00000 | 1.50839  |
| 38 | -973.64548 | 6.28784  |          |
| 39 | -467.87775 | 23.00000 | 1.50839  |
| 40 | -215.12034 | 1.14438  |          |
| 41 | 2688.16000 | 23.00000 | 1.50839  |
| 42 | -320.45010 | 2.92283  |          |
| 43 | 441.22198  | 40.00000 | 1.50839  |
| 44 | -347.09282 | 9.43495  |          |
| 45 | -239.46132 | 27.00000 | 1.50839  |
| 46 | -386.98159 | 1.10071  |          |
| 47 | 381.41679  | 28.00000 | 1.50839  |
| 48 | -2576.25000 | 4.83032 |          |
| 49 | 186.44642  | 29.00000 | 1.50839  |
| 50 | 570.80649  | 3.29194  |          |
| 51 | 138.75412  | 39.90000 | 1.50839  |
| 52 | 316.26440  | 9.82671  |          |
| 53 | 504.37073  | 23.00000 | 1.50839  |
| 54 | 80.26770   | 7.04896  |          |
| 55 | 91.17058   | 71.00000 | 1.50839  |
| 56 | 1553.61000 |          |          |

TABLE 6

Values corresponding to the Conditions in the Third Embodiment (1) $f_1/f_3 = 1.46$
(2) $f_2/f_4 = 1.27$
(3) $f_5/L = 0.0977$
(4) $f_6/L = 0.156$
(5) $f_n/>f_2 = 0.591$
(6) $I/L = 2.93$
(7) $f_{24}/f_{23} = 0.816$
(8) $f_{22}/f_{23} = 1.04$
(9) $D/L = 0.0848$
(10) $f_4/L = -0.0645$
(11) $f_2/L = -0.0816$
(12) $(r_{5p} - r_{5n})/(r_{5p} + r_{5n}) = 0.184$
(13) $(r_{4F} - r_{4R})/(r_{4F} + r_{4R}) = -0.698$
(14) $(r_{5R} - r_{6F})/(r_{5R} + r_{6F}) = -0.0636$
(15) $d_{56}/L = 0.00587$
(16) $d_6/r_{6F} = 1.10$
(17) $(r_{5F} - r_{5R})/(r_{5F} + r_{5R}) = 0.725$
(18) $1/(\phi_{21} \cdot L) = 0.590$
(19) $f_{21}/L = 0.234$
(20) $f_{2F}/f_{2R} = 0.611$

TABLE 7

Fourth Embodiment $d_0 = 104.71662$
$B = 1/5$
$NA = 0.55$
$Bf = 28.76320$

L = 1200

| | r | d | n |
|---|---|---|---|
| 1 | 955.26796 | 23.00000 | 1.50839 |
| 2 | −675.53148 | 20.81278 | |
| 3 | 788.04209 | 24.00000 | 1.50839 |
| 4 | −320.77870 | 7.92536 | |
| 5 | −261.99847 | 20.00000 | 1.50839 |
| 6 | −613.40707 | 1.04750 | |
| 7 | 343.77433 | 27.00000 | 1.50839 |
| 8 | −614.74297 | 0.97572 | |
| 9 | 220.40014 | 24.00000 | 1.50839 |
| 10 | 111.87626 | 27.04713 | |
| 11 | 230.00000 | 23.00000 | 1.50839 |
| 12 | −410.00000 | 1.10686 | |
| 13 | −2449.05000 | 17.00000 | 1.50839 |
| 14 | 118.87129 | 18.76700 | |
| 15 | −632.77988 | 12.90000 | 1.50839 |
| 16 | 143.15226 | 26.88549 | |
| 17 | −108.88557 | 15.00000 | 1.50839 |
| 18 | 595.22400 | 52.22565 | |
| 19 | 1526.21000 | 35.00000 | 1.50839 |
| 20 | −168.52598 | 14.91509 | |
| 21 | −120.87196 | 22.80000 | 1.50839 |
| 22 | −188.10351 | 2.79782 | |
| 23 | −3191.22000 | 27.00000 | 1.50839 |
| 24 | −296.62706 | 2.87255 | |
| 25 | 697.45117 | 28.00000 | 1.50839 |
| 26 | −669.27158 | 2.49780 | |
| 27 | 358.82454 | 27.00000 | 1.50839 |
| 28 | −2986.21000 | 1.64701 | |
| 29 | 223.50,971 | 31.00000 | 1.50839 |
| 30 | −1510.16000 | 8.60527 | |
| 31 | −3596.81000 | 21.00000 | 1.50839 |
| 32 | 141.11696 | 9.76890 | |
| 33 | 194.35300 | 17.00000 | 1.50839 |
| 34 | 157.66411 | 31.54706 | |
| 35 | −209.96142 | 15.90000 | 1.50839 |
| 36 | 307.10883 | 56.68624 | |
| 37 | −175.13115 | 18.00000 | 1.50839 |
| 38 | −1162.95000 | 6.28784 | |
| 39 | −505.38166 | 23.00000 | 1.50839 |
| 40 | −213.39177 | 1.14438 | |
| 41 | 3114.45000 | 23.00000 | 1.50839 |
| 42 | −339.03822 | 2.92283 | |
| 43 | 460.54759 | 40.00000 | 1.50839 |
| 44 | −326.27369 | 9.43498 | |
| 45 | −231.89968 | 27.00000 | 1.50839 |
| 46 | −372.57441 | 1.10071 | |
| 47 | 390.03678 | 28.00000 | 1.50839 |
| 48 | −1994.66000 | 4.83032 | |
| 49 | 182.18377 | 29.00000 | 1.50839 |
| 50 | 525.45378 | 3.29194 | |
| 51 | 138.67730 | 39.90000 | 1.50839 |
| 52 | 312.43609 | 9.82671 | |
| 53 | 511.48346 | 23.00000 | 1.50839 |
| 54 | 81.45867 | 7.04896 | |
| 55 | 93.64185 | 34.00000 | 1.50839 |
| 56 | 934.34560 | 2.00000 | |
| 57 | 826.70065 | 35.00000 | 1.50839 |
| 58 | 1680.21000 | (Bf) | |

TABLE 8

Values corresponding to the Conditions in the Fourth Embodiment (1) $f_1/f_3 = 1.55$
(2) $f_2/f_4 = 1.39$
(3) $f_5/L = 0.0975$
(4) $f_6/L = 0.158$
(5) $f_n/f_2 = 0.576$
(6) $I/L = 3.05$
(7) $f_{24}/f_{23} = 0.787$
(8) $f_{22}/f_{23} = 0.974$
(9) $D/L = 0.0851$
(10) $f_4/L = -0.0606$
(11) $f_2/L = -0.0843$
(12) $(r_{Sp} - r_{Sn})/(r_{Sp} + r_{Sn}) = 0.169$ TABLE 8-continued Values corresponding to the Conditions in the Fourth Embodiment

(13) $(r_{4F} - r_{4R})/(r_{4F} + r_{4R}) = -0.738$
(14) $(r_{5R} - r_{6F})/(r_{5R} + r_{6F}) = -0.0695$
(15) $d_{56}/L = 0.00587$
(16) $d_6/r_{6F} = 1.07$
(17) $(r_{5F} - r_{5R})/(r_{5F} + r_{5R}) = 0.725$
(18) $1/(\phi_{21} \cdot L) = 0.672$
(19) $f_{21}/L = 0.244$
(20) $f_{2F}/f_{2R} = 0.642$

TABLE 9

Fifth Embodiment $d_0 = 105.99385$
$B = 1/5$
$NA = 0.55$
$Bf = 28.96856$
$L = 1200$

| | r | d | n |
|---|---|---|---|
| 1 | 723.32335 | 28.00000 | 1.50839 |
| 2 | −571.27029 | 2.00000 | |
| 3 | −8470.94995 | 20.00000 | 1.50839 |
| 4 | 324.13159 | 7.92536 | |
| 5 | 360.44110 | 28.00000 | 1.50839 |
| 6 | −432.97069 | 1.04750 | |
| 7 | 397.04484 | 27.00000 | 1.50839 |
| 8 | −825.96923 | 0.97572 | |
| 9 | 214.74004 | 31.00000 | 1.50839 |
| 10 | 110.51892 | 24.04713 | |
| 11 | 229.41181 | 26.00000 | 1.50839 |
| 12 | −396.52854 | 1.10686 | |
| 13 | −1014.34000 | 17.00000 | 1.50839 |
| 14 | 137.90605 | 18.76700 | |
| 15 | −418.55207 | 12.90000 | 1.50839 |
| 16 | 138.89479 | 26.88549 | |
| 17 | −133.71351 | 15.00000 | 1.50839 |
| 18 | 561.35918 | 52.53782 | |
| 19 | 1381.31000 | 35.00000 | 1.50839 |
| 20 | −188.69074 | 14.91509 | |
| 21 | −134.03345 | 22.80000 | 1.50839 |
| 22 | −198.69180 | 2.79782 | |
| 23 | −3029.37000 | 27.00000 | 1.50839 |
| 24 | −333.96362 | 2.87255 | |
| 25 | 905.53484 | 28.00000 | 1.50839 |
| 26 | −611.80005 | 2.49780 | |
| 27 | 254.70879 | 30.00000 | 1.50839 |
| 28 | 3936.53000 | 1.64701 | |
| 29 | 239.51669 | 31.00000 | 1.50839 |
| 30 | −1238.94000 | 5.60527 | |
| 31 | −2379.42001 | 21.00000 | 1.50839 |
| 32 | 150.43068 | 9.76890 | |
| 33 | 209.21387 | 17.00000 | 1.50839 |
| 34 | 149.67785 | 31.54706 | |
| 35 | −199.55198 | 15.90000 | 1.50839 |
| 36 | 341.76300 | 57.70880 | |
| 37 | −170.75300 | 18.00000 | 1.50839 |
| 38 | −3700.60999 | 6.28784 | |
| 39 | −1025.75000 | 23.00000 | 1.50839 |
| 40 | −212.37919 | 1.14438 | |
| 41 | −3009.97000 | 23.00000 | 1.50839 |
| 42 | −312.33647 | 2.92283 | |
| 43 | 401.05778 | 37.00000 | 1.50839 |
| 44 | −361.42967 | 12.43498 | |
| 45 | −231.63315 | 27.00000 | 1.50839 |
| 46 | −319.48896 | 1.10071 | |
| 47 | 355.64919 | 25.00000 | 1.50839 |
| 48 | 3678.53000 | 4.83032 | |
| 49 | 177.43364 | 32.00000 | 1.50839 |
| 50 | 553.83964 | 3.29194 | |
| 51 | 137.68248 | 39.90000 | 1.50839 |
| 52 | 330.86342 | 9.82671 | |

TABLE 9-continued

Fifth Embodiment

| | | | |
|---|---|---|---|
| 53 | 587.42747 | 23.00000 | 1.50839 |
| 54 | 81.23164 | 7.04896 | |
| 55 | 93.74477 | 71.00000 | 1.50839 |
| 56 | 1555.42999 | | |

TABLE 10

Values corresponding to the Conditions in the Fifth Embodiment (1) $f_1/f_3 = 1.58$
(2) $f_2/f_4 = 1.63$
(3) $f_5/L = 0.0923$
(4) $f_6/L = 0.161$
(5) $f_n/f_2 = 0.554$
(6) $I/L = 2.27$
(7) $f_{24}/f_{23} = 1.04$
(8) $f_{22}/f_{23} = 1.17$
(9) $D/L = 0.0853$
(10) $f_4/L = -0.0564$
(11) $f_2/L = -0.0919$
(12) $(r_{5p} - r_{5n})/(r_{5p} + r_{5n}) = 0.219$
(13) $(r_{4F} - r_{4R})/(r_{4F} + r_{4R}) = -0.912$
(14) $(r_{5R} - r_{6F})/(r_{5R} + r_{6F}) = -0.0715$
(15) $d_{56}/L = 0.00587$
(16) $d_6/r_{6F} = 1.07$
(17) $(r_{5F} - r_{5R})/(r_{5F} + r_{5R}) = 0.757$
(18) $1/(\phi_{21} \cdot L) = 0.650$
(19) $f_{21}/L = 0.242$
(20) $f_{2F}/f_{2R} = 0.541$

TABLE 11

Sixth Embodiment d0 = 105.91377
B = 1/5
NA = 0.55
Bf = 28.96856
L = 1200

| | r | d | n |
|---|---|---|---|
| 1 | 723.70616 | 28.00000 | 1.50839 |
| 2 | -571.49375 | 1.98414 | |
| 3 | -8427.42000 | 20.00000 | 1.50839 |
| 4 | 324.06902 | 8.06076 | |
| 5 | 360.49965 | 28.00000 | 1.50839 |
| 6 | -432.97519 | 1.01484 | |
| 7 | 397.09644 | 27.00000 | 1.50839 |
| 8 | -826.03537 | 0.88781 | |
| 9 | 214.74356 | 31.00000 | 1.50839 |
| 10 | 110.51666 | 24.03750 | |
| 11 | 229.41181 | 26.00000 | 1.50839 |
| 12 | -396.60684 | 1.12963 | |
| 13 | -1014.38000 | 17.00000 | 1.50839 |
| 14 | 137.92108 | 18.76756 | |
| 15 | -418.59453 | 12.90000 | 1.50839 |
| 16 | 138.90550 | 26.88587 | |
| 17 | -133.71351 | 15.00000 | 1.50839 |
| 18 | 561.20342 | 52.51989 | |
| 19 | 1381.31000 | 35.00000 | 1.50839 |
| 20 | -188.68876 | 14.85490 | |
| 21 | -134.03581 | 22.80000 | 1.50839 |
| 22 | -198.68592 | 2.89585 | |
| 23 | -3029.37000 | 27.00000 | 1.50839 |
| 24 | -333.96362 | 2.88769 | |
| 25 | 905.64444 | 28.00000 | 1.50839 |
| 26 | -611.80428 | 2.47699 | |
| 27 | 254.70879 | 30.00000 | 1.50839 |
| 28 | 3936.53000 | 1.61920 | |
| 29 | 239.51669 | 31.00000 | 1.50839 |

TABLE 11-continued

Sixth Embodiment

| | | | |
|---|---|---|---|
| 30 | -1238.94000 | 5.60156 | |
| 31 | -2379.42000 | 21.00000 | 1.50839 |
| 32 | 150.42879 | 9.73510 | |
| 33 | 209.20275 | 16.99160 | 1.50839 |
| 34 | 149.68297 | 31.54706 | |
| 35 | -199.55198 | 15.90229 | 1.50839 |
| 36 | 341.76300 | 57.70389 | |
| 37 | -170.75300 | 18.00000 | 1.50839 |
| 38 | -3700.61000 | 6.28293 | |
| 39 | -1025.75000 | 23.00000 | 1.50839 |
| 40 | -212.37919 | 1.14438 | |
| 41 | -3009.97000 | 23.00000 | 1.50839 |
| 42 | -312.33647 | 2.89661 | |
| 43 | 401.05778 | 37.00000 | 1.50839 |
| 44 | -361.42967 | 12.47918 | |
| 45 | -231.65257 | 27.00000 | 1.50839 |
| 46 | -319.51171 | 1.23912 | |
| 47 | 355.64919 | 25.00000 | 1.50839 |
| 48 | 3678.53000 | 4.82925 | |
| 49 | 177.43453 | 32.00000 | 1.50839 |
| 50 | 553.98339 | 3.26768 | |
| 51 | 137.68248 | 39.90000 | 1.50839 |
| 52 | 330.86342 | 9.82671 | |
| 53 | 587.42747 | 23.00000 | 1.50839 |
| 54 | 81.23164 | 7.04896 | |
| 55 | 93.74477 | 71.00000 | 1.50839 |
| 56 | 1555.43000 | (Bf) | |

TABLE 12

Values corresponding to the Conditions in the Sixth Embodiment (1) $f_1/f_3 = 1.58$
(2) $f_2/f_4 = 1.63$
(3) $f_5/L = 0.0924$
(4) $f_6/L = 0.161$
(5) $f_n/f_2 = 0.554$
(6) $I/L = 2.25$
(7) $f_{24}/f_{23} = 1.04$
(8) $f_{22}/f_{23} = 1.17$
(9) $D/L = 0.0853$
(10) $f_4/L = -0.0564$
(11) $f_2/L = -0.0919$
(12) $(r_{5p} - r_{5n})/(r_{5p} + r_{5n}) = 0.218$
(13) $(r_{4F} - r_{4R})/(r_{4F} + r_{4R}) = -0.911$
(14) $(r_{5R} - r_{6F})/(r_{5R} + r_{6F}) = -0.0715$
(15) $d_{56}/L = 0.00587$
(16) $d_6/r_{6F} = 1.07$
(17) $(r_{5F} - r_{5R})/(r_{5F} + r_{5R}) = 0.757$
(18) $1/(\phi_{21} \cdot L) = 0.650$
(19) $f_{21}/L = 0.242$
(20) $f_{2F}/f_{2R} = 0.541$ In the above-described first embodiment, $1/|\phi L|=0.149$ for the object-side lens surface of the positive lens $L_{61}$, thus satisfying the condition (21). In the second embodiment, $1/|\phi L|=0.152$ for the object-side lens surface of the positive lens $L_{61}$ and $1/|\phi L|=0.709$ for the object-side lens surface of the positive lens $L_{62}$, thus satisfying the condition (21). In the third embodiment, $1/|\phi L|=0.149$ for the object-side lens surface of the positive lens $L_{61}$, thus satisfying the condition (21). In the fourth embodiment, $1/|\phi L|=0.153$ for the object-side lens surface of the positive lens $L_{61}$ and $1/|\phi L|=1.36$ for the object-side lens surface of the positive lens $L_{62}$, thus satisfying the condition (21). In the fifth embodiment, $1/|\phi L|=0.153$ for the object-side lens surface of the positive lens $L_{61}$, thus satisfying the condition (21). In the sixth embodiment, $1/|\phi L|=0.154$ for the object-side lens surface of the positive lens $L_{61}$, thus satisfying the condition (21). Therefore, the sixth lens group $G_6$ in each embodiment is composed of three or less lenses having the lens surface(s) satisfying the condition (21).

From the above values of specifications for the respective embodiments, it is understood that the telecentricity is achieved on the object side (on the reticle side) and on the image side (on the wafer side) while maintaining a relatively wide exposure area and a large numerical aperture in each embodiment.

FIG. 9, FIG. 10, FIG. 11, FIG. 12, FIG. 13, and FIG. 14 show aberration diagrams of various aberrations in the first to the sixth embodiments according to the present invention.

Here, in each aberration diagram, NA represents the numerical aperture of the projection optical system and Y the image height. In each aberration diagram of astigmatism, the dotted line represents a meridional image surface (meridional image surface) and the solid line a sagittal image surface (sagittal image surface).

From comparison of the aberration diagrams, it is seen that the various aberrations are corrected in a good balance in each embodiment, particularly the distortion is corrected very well over the entire image up to a nearly zero state and the high-resolving-power projection optical system is achieved with a large numerical aperture.

Although the above embodiments showed the examples where the excimer laser for supplying the light of 248.4 nm was used as a light source, it is needless to mention that, without a need to be limited to the examples, the present invention can be applied to systems using extreme ultraviolet light sources such as an excimer laser for supplying the light of 193 nm, mercury arc lamps for supplying the light of the g-line (436 nm) or the i-line (365 nm), or light sources for supplying the light in the ultraviolet region other than those.

In the embodiments neither of the lenses constituting the projection optical system is a compound lens, and either of them is made of a single optical material, i.e., of quartz ($SiO_2$). Here, a cost reduction can be achieved because a single optical material forms each lens in the above embodiments. However, if the exposure light has a certain half width, a chromatic aberration can be corrected by a combination of quartz ($SiO_2$) and fluorite ($CaF_2$) or by a combination of other optical materials. Further, if the exposure light source supplies the exposure light in a wide band, the chromatic aberration can be corrected by a combination of plural types of optical materials.

As described above, the exposure apparatus relating to the present invention has achieved the projection optical systems which are bitelecentric optical systems with a relatively wide exposure area kept and which are high-resolving-power projection optical systems in which the various aberrations are corrected in a good balance and which have a large numerical aperture. Particularly, the distortion is corrected very well in the projection optical systems of the present invention. Accordingly, the present invention can enjoy an extreme reduction of image stress, because the distortion is also corrected very well in addition to the achievement of the bitelecentricity.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 6-311050 (311050/1994) filed on Dec. 14, 1994 is hereby incorporated by reference.

What is claimed is:

1. A projection optical system located between a first object and a second object, for projecting an image of the first object onto the second object, said projection optical system having:

a first lens group with positive refracting power, said first lens group being placed between the first and second objects;

a second lens group with negative refracting power, said second lens group being placed between said first lens group and the second object;

a third lens group with positive refracting power, said third lens group being placed between said second lens group and the second object;

a fourth lens group with negative refracting power, said fourth lens group being placed between said third lens group and the second object;

a fifth lens group with positive refracting power, said fifth lens group being placed between said fourth lens group and the second object; and a sixth lens group with positive refracting power, said six lens group being placed between said fifth lens group and the second object, wherein said first lens group includes at least two positive lenses, said third lens group includes at least three positive lenses, said fourth lens group includes at least three negative lenses, said fifth lens group includes at least five positive lenses and at least one negative lens, and said sixth lens group includes at least one positive lens, wherein said second lens group comprises a front lens placed as closest to the first object and having negative refracting power with a concave surface to the second object, a rear lens placed as closest to the second object and having negative refracting power with a concave surface to the first object, and an intermediate lens group placed between said front and rear lenses in said second lens group, and wherein said intermediate lens group has a first lens with positive refracting power, a second lens with negative refracting power, a third lens with negative refracting power, and a fourth lens with negative refracting power in the named order from the first object toward the second object.

2. A projection optical system according to claim 1, wherein the first lens with positive refracting power in said intermediate lens group in said second lens group has a lens shape with a convex surface to the second object.

3. A projection optical system according to claim 2, wherein said fourth lens group comprises a front lens placed as closest to the first object and having negative refracting power with a concave surface to the second object, a rear lens placed as closest to the second object and having negative refracting power with a concave surface to the first object, and at least one negative lens placed between said front lens in said fourth lens group and said rear lens in said fourth lens group.

4. A projection optical system according to claim 3, wherein said fifth lens group comprises a negative meniscus lens, and a positive lens placed as adjacent to a concave surface of said negative meniscus lens and having a convex surface opposed to the concave surface of said negative meniscus lens.

5. A projection optical system according to claim 4, wherein said negative meniscus lens and said positive lens adjacent to the concave surface of said negative meniscus lens are placed between positive lenses in said fifth lens group.

6. A projection optical system according to claim 5, wherein said fifth lens group comprises a negative lens placed as closest to the second object and having a concave surface opposed to the second object.

7. A method for fabricating at least semiconductor devices or liquid crystal display devices by using a projection optical system according to claim 5, comprising the steps of:
illuminating a mask prepared as said first object with light of a predetermined wavelength, said mask being formed a predetermined pattern thereon; and
projecting an image of the pattern on said mask onto a photosensitive substrate prepared as said second object through said projection optical system, thereby performing an exposure process.

8. A projection optical system according to claim 6, wherein said sixth lens group comprises a lens placed as closest to the first object and having a convex surface opposed to the first object.

9. A method for fabricating at least semiconductor devices or liquid crystal display devices by using a projection optical system according to claim 8, comprising the steps of:
illuminating a mask prepared as said first object with light of a predetermined wavelength, said mask being formed a predetermined pattern thereon; and
projecting an image of the pattern on said mask onto a photosensitive substrate prepared as said second object through said projection optical system, thereby performing an exposure process.

10. A projection optical system according to claim 1, wherein said fourth lens group comprises a front lens placed as closest to the first object and having negative refracting power with a concave surface to the second object, a rear lens placed as closest to the second object and having a negative refracting power with a concave surface to the first object, and at least one negative lens placed between said front lens in said fourth lens group and said rear lens in said fourth lens group.

11. A projection optical system according to claim 1, wherein said fifth lens group comprises a negative meniscus lens, and a positive lens placed as adjacent to a concave surface of said negative meniscus lens and having a convex surface opposed to the concave surface of said negative meniscus lens.

12. A method for fabricating at least semiconductor devices or liquid crystal display devices by using a projection optical system according to claim 1, comprising the steps of:
illuminating a mask prepared as said first object with light of a predetermined wavelength, said mask being formed a predetermined pattern thereon; and
projecting an image of the pattern on said mask onto a photosensitive substrate prepared as said second object through said projection optical system, thereby performing an exposure process.

13. A projection optical system located between a first object and a second object, said projection optical system having a first lens group with positive refracting power, a second lens group with negative refracting power, a third lens group with positive refracting power, a fourth lens group with negative refracting power, a fifth lens group with positive refracting power, and a sixth lens group with positive refracting power in the named order from the first object toward the second object,
wherein said first lens group includes at least two positive lenses, said third lens group includes at least three positive lenses, said fourth lens group includes at least three negative lenses, said fifth lens group includes at least five positive lenses and at least one negative lens, and said sixth lens group includes at least one positive lens,
wherein said second lens group comprises a front lens placed as closest to the first object and having negative refracting power with a concave surface to the second object, a rear lens placed as closest to the second object and having negative refracting power with a concave surface to the first object, and an intermediate lens group placed between said front and rear lenses in said second lens group,
wherein said intermediate lens group has a first lens with positive refracting power, a second lens with negative refracting power, a third lens with negative refracting power, and a fourth lens with negative refracting power in the named order from the first object toward the second object, and
wherein the following conditions are satisfied when a focal length of said first lens group is $f_1$, a focal length of said second lens group is $f_2$, a focal length of said third lens group is $f_3$, a focal length of said fourth lens group is $f_4$, a focal length of said fifth lens group is $f_5$, a focal length of said sixth lens group is $f_6$, an overall focal length of said second lens to said fourth lens in said intermediate lens group in said second lens group is $f_n$, and a distance from the first object to the second object is L:

$$0.1 < f_1/f_3 < 17$$

$$0.1 < f_2/f_4 < 14$$

$$0.01 < f_5/L < 0.9$$

$$0.02 < f_6/L < 1.6$$

$$0.01 < f_n/f_2 < 2.0.$$

14. A projection optical system according to claim 13, wherein the following condition is satisfied when an axial distance from the first object to a first-object-side focal point of the whole of said projection optical system is I and the distance from the first object to the second object is L:

$$1.0 < I/L.$$

15. A projection optical system according to claim 14, therein the following condition is satisfied when a focal length of said third lens with negative refracting power in said second lens group is $f_{23}$ and a focal length of said fourth lens with negative refracting power in said intermediate lens group in said second lens group is $f_{24}$:

$$0.07 < f_{24}/f_{23} < 7.$$

16. A projection optical system according to claim 15, wherein the following condition is satisfied when a focal length of said second lens with negative refracting power in said intermediate lens group in said second lens group is $f_{22}$ and a focal length of said third lens with negative refracting power in said intermediate lens group in said second lens group is $f_{23}$:

$$0.01 < f_{22}/f_{23} < 10.$$

17. A projection optical system according to claim 16, wherein the following condition is satisfied when a focal length of said first lens with positive refracting power in said intermediate lens group in second lens group is $f_{21}$ and the distance from the first object to the second object is L:

$$0.230<f_{21}/L<0.40.$$

18. A method for fabricating at least semiconductor devices or liquid crystal display devices by using a projection optical system according to claim 16, comprising the steps of:
   illuminating a mask prepared as said first object with light of a predetermined wavelength, said mask being formed a predetermined pattern thereon; and
   projecting an image of the pattern on said mask onto a photosensitive substrate prepared as said second object through said projection optical system, thereby performing an exposure process.

19. A projection optical system according to claim 13, wherein said intermediate lens group in said second lens group has negative refracting power.

20. A projection optical system according to claim 13, wherein the following condition is satisfied when the focal length of said second lens group is $f_2$ and the distance from the first object to the second object is L:

$$-0.8<f_2/L<-0.050.$$

21. A projection optical system according to claim 13, wherein the following condition is satisfied when a focal length of said front lens placed as closest to the first object in said second lens group and having negative refracting power with a concave surface to the second object is $f_{2F}$ and a focal length of said rear lens placed as closest to the second object in said second lens group and having negative refracting power with a concave surface to the first object is $f_{2R}$:

$$0 \leq f_{2F}/f_{2R}<18.$$

22. A projection optical system according to claim 13, wherein the following condition is satisfied when a focal length of said third lens with negative refracting power in said second lens group is $f_{23}$ and a focal length of said fourth lens with negative refracting power in said intermediate lens group in said second lens group is $f_{24}$:

$$0.07<f_{24}/f_{23}<7.$$

23. A projection optical system according to claim 13, wherein the following condition is satisfied when a focal length of said second lens with negative refracting power in said intermediate lens group in said second lens group is $f_{22}$ and a focal length of said third lens with negative refracting power in said intermediate lens group in said second lens group is $f_{23}$:

$$0.1<f_{22}/f_{23}<10.$$

24. A projection optical system according to claim 13, wherein the following condition is satisfied when an axial distance from a second-object-side lens surface of said fourth lens with negative refracting power in said intermediate lens group in said second lens group to a first-object-side lens surface of said rear lens in said second lens group is D and the distance from the first object to the second object is L:

$$0.05<D/L<0.4.$$

25. A projection optical system according to claim 13, wherein said first lens with positive refracting power in said intermediate lens group in said second lens group has a lens shape with a convex surface to the second object, and
   wherein the following condition is satisfied when the refracting power of a second-object-side lens surface of said first lens with positive refracting power in said intermediate lens group in said second lens group is $\Phi_{21}$ and the distance from the first object to the second object is L:

$$0.54<1/(\Phi_{21} \cdot L)<10.$$

26. A projection optical system according to claim 13, wherein the following condition is satisfied when a focal length of said first lens with positive refracting power in said intermediate lens group in said second lens group is $f_{21}$ and the distance from the first object to the second object is L:

$$0.230<f_{21}/L<0.40.$$

27. A projection optical system according to claim 13, wherein the following condition is satisfied when the focal length of said fourth lens group is $f_4$ and the distance from said the first object to the second object is L:

$$-0.098<f_4/L<-0.005.$$

28. A projection optical system according to claim 13, wherein said fourth lens group comprises a front lens placed as closest to the first object and having negative refracting power with a concave surface to the second object, a rear lens placed as closest to the second object and having negative refracting power with a concave surface to the first object, and at least one negative lens placed between said front lens in said fourth lens group and said rear lens in said fourth lens group, and
   wherein the following condition is satisfied when a radius of curvature on the first object side in said rear lens placed as closest to the second object in said fourth lens group is $r_{4F}$ and a radius of curvature on the second object side in said rear lens placed as closest to the second object in said fourth lens group is $r_{4R}$:

$$-1.00 \leq (r_{4F}-r_{4R})/(r_{4F}+r_{4R})<0.$$

29. A projection optical system according to claim 13, wherein said fifth lens group comprises a negative meniscus lens, and a positive lens placed as adjacent to a concave surface of said negative meniscus lens and having a convex surface opposed to the concave surface of said negative meniscus lens, and
   wherein the following condition is satisfied when a radius of curvature of the concave surface of said negative meniscus lens in said fifth lens group is $r_{5n}$ and a radius of curvature of the convex surface opposed to the concave surface of said negative meniscus lens in said positive lens placed adjacent to the concave surface of said negative meniscus lens in said fifth lens group is $r_{5p}$:

$$0<(r_{5p}-r_{5n})/(r_{5p}+r_{5n})<1.$$

30. A projection optical system according to claim 29, wherein said negative meniscus lens and said positive lens adjacent to the concave surface of said negative meniscus lens are placed between positive lenses in said fifth lens group.

31. A projection optical system according to claim 13, wherein said fifth lens group comprises a negative lens placed as closest to the second object and having a concave surface opposed to the second object, and
   wherein the following condition is satisfied when a radius of curvature on the first object side in said negative lens closest to the second object in said fifth lens group is $r_{5F}$ and a radius of curvature on the second object side in said negative lens closest to the second object in said fifth lens group is $r_{5R}$:

$$0.30 < (r_{5F} - r_{5R})/(r_{5F} + r_{5R}) < 1.28.$$

32. A projection optical system according to claim 13, wherein said fifth lens group comprises a negative lens placed as closest to the second object and having a concave surface opposed to the second object and said sixth lens group comprises a lens placed as closest to the first object and having a convex surface opposed to the first object, and
wherein the following condition is satisfied when a radius of curvature on the second object side, of said negative lens placed as closest to the second object in said fifth lens group is $r_{5R}$ and a radius of curvature on the first object side, of said lens placed as closest to the first object in said sixth lens group is $r_{6F}$:

$$-0.90 < (r_{5R} - r_{6F})/(r_{5R} + r_{6F}) < -0.001.$$

33. A projection optical system according to claim 13, wherein the following condition is satisfied when a lens group separation between said fifth lens group and said sixth lens group is $d_{56}$ and the distance from the first object to the second object is L:

$$d_{56}/L < 0.017.$$

34. A projection optical system according to claim 13, wherein the following condition is satisfied when a radius of curvature of a lens surface closest to the first object in said sixth lens group is $r_{6F}$ and an axial distance from the lens surface closest to the first object in said sixth lens group to the second object is $d_6$:

$$0.50 < d_6/r_{6F} < 1.50.$$

35. A projection optical system according to claim 13, wherein said sixth lens group comprises three or less lenses having at least one surface satisfying the following condition:

$$1/|\Phi L| < 20,$$

where $\Phi$: refracting power of the lens surface;
L: object-image distance from the first object to the second object.

36. A projection optical system according to claim 13, wherein a magnification of said projection optical system is 5:1.

37. A method for fabricating at least semiconductor devices or liquid crystal display devices by using a projection optical system according to claim 13, comprising the steps of:
illuminating a mask prepared as said first object with light of a predetermined wavelength, said mask being formed a predetermined pattern thereon; and
projecting an image of the pattern on said mask onto a photosensitive substrate prepared as said second object through said projection optical system, thereby performing an exposure process.

38. A projection optical system according to claim 13, wherein said fifth lens group comprises a negative lens placed as closest to the second object and having a concave surface opposed to the second object.

39. A projection optical system according to claim 38, wherein the following condition is satisfied when a lens group separation between said fifth lens group and said sixth lens group is $d_{56}$ and the distance from the first object to the second object is L:

$$d_{56}/L < 0.017.$$

40. A projection optical system according to claim 38, wherein the following condition is satisfied when a radius of curvature of a lens surface closest to the first object in said sixth lens group is $r_{6F}$ and an axial distance from the lens surface closest to the first object in said sixth lens group to the second object is $d_6$:

$$0.50 < d_6/r_{6F} < 1.50.$$

41. A projection optical system according to claim 38, wherein said sixth lens group comprises three or less lenses having at least one surface satisfying the following condition:

$$1/|\Phi L| < 20.$$

where $\Phi$: refracting power of the lens surface;
L: object-image distance from the first object to the second object.

42. An exposure apparatus comprising:
a stage allowing a photosensitive substrate to be held on a main surface thereof;
an illumination optical system for emitting exposure light of a predetermined wavelength and transferring a predetermined pattern on a mask onto the substrate; and
a projecting optical system for projecting an image of the mask, on the substrate surface, said projecting optical system having:
a first lens group with positive refracting power, said first lens group being placed between the mask and the main surface of said stage;
a second lens group with negative refracting power, said second lens group being placed between said first lens group and the main surface of said stage;
a third lens group with positive refracting power, said third lens groups being placed between said second lens group and the main surface of said stage;
a fourth lens group with negative refracting power, said fourth lens group being placed between said third lens group and the main surface of said stage;
a fifth lens group with positive refracting power, said fifth lens group being placed between said fourth lens group and the main surface of said stage; and
a sixth lens group, said sixth lens group being placed between said fifth lens group and the main surface of said stage,
wherein said first lens group includes at least two positive lenses, said third lens group includes at least three positive lenses, said fourth lens group includes at least three negative lenses, said fifth lens group includes at least five positive lenses and at least one negative lens, and said sixth lens group includes at least one positive lens,
wherein said second lens group comprises a front lens placed as closest to the first object and having a negative refracting power with a concave surface to the second object, a rear lens as closest to the second object and having negative refracting power with a concave surface to the first object, and an intermediate lens group placed between said front and rear lenses in said second lens group, and
wherein said intermediate lens group has a first lens with positive refracting power, a second lens with negative refracting power, a third lens with negative refracting power, and a fourth lens with negative refracting power in the named order from the first object toward the second object.

43. An exposure apparatus according to claim 42,
wherein the following conditions are satisfied when a focal length of said first lens group is $f_1$, a focal length of said second lens group is $f_2$, a focal length of said third lens group is $f_3$, a focal length of said fourth lens group is $f_4$, a focal length of said fifth lens group is $f_5$, a focal length of said sixth lens group is $f_6$, an overall focal length of said second lens to said fourth lens in said intermediate lens group in said second lens group is $f_n$, and a distance from the first object to the second object is L:

$0.1 < f_1/f_3 < 17$ $0.1 < f_1/f_4 < 14$ $0.01 < f_5/L < 0.9$ $0.02 < f_6/L < 1.6$ $0.01 < f_n/f_2 < 2.0$.

44. A projection optical system located between a first object and a second object, for projecting an image of the first object onto the second object, said projection optical system having:
 a first lens group with positive refracting power, said first lens group being placed between the first and second objects;
 a second lens group with negative refracting power, said second lens group being placed between said first lens group and the second object;
 a third lens group with positive power, said third lens group being placed between said second lens group and the second object;
 a fourth lens group with negative refracting power, said fourth lens group being placed between said third lens group and the second object;
 a fifth lens group with positive refracting power, said fifth lens group being placed between said fourth lens group and the second object; and
 a sixth lens group with positive refracting power, said six lens group being placed between said fifth lens group and the second object,
 wherein said first lens group includes at least two positive lenses, said third lens group includes at least three positive lenses, said fourth lens group includes at least three negative lenses, said fifth lens group includes at least five positive lenses and at least one negative lens, and said sixth lens group includes at least one positive lens, and
 wherein said fifth lens group comprises a negative meniscus lens, and a positive lens placed as adjacent to a concave surface of said negative meniscus lens and having a convex surface opposed to the concave surface of said negative meniscus lens.

45. A projection optical system according to claim 44, wherein said negative meniscus lens and said positive lens adjacent to the concave surface of said negative meniscus lens are placed between positive lenses in said fifth lens group.

46. A projection optical system according to claim 45, wherein the following condition is satisfied when an axial distance from the first object to a first-object-side focal point of the whole of said projection optical system is I and the distance from the first object to the second object is L:

$1.0 < I/L$.

47. A projection optical system according to claim 46, wherein said fourth lens group comprises a front lens placed as closest to the first object and having negative refracting power with a concave surface to the second object, a rear lens placed as closest to the second object and having negative refracting power with a concave surface to the first object, and at least one negative lens placed between said front lens in said fourth lens group and said rear lens in said fourth lens group.

48. A projection optical system according to claim 47,
 wherein said second lens group comprises a front lens placed as closest to the first object and having negative refracting power with a concave surface to the second object, a rear lens placed as closest to the second object and having negative refracting power with a concave to the second object and having negative refracting power with a concave surface to the first object, and an intermediate lens group placed between said front and rear lenses in said second lens group,
 wherein said intermediate lens group has a first lens with positive refracting power, a second lens with negative refracting power, a third lens with negative refracting power, and a fourth lens with negative refracting power in the named order from the first object toward the second object, and
 wherein the following conditions are satisfied when a focal length of said first lens group is $f_1$, a focal length of said second lens group is $f_2$, a focal length of said third lens group is $f_3$, a focal length of said fourth lens group is $f_4$, a focal length of said fifth lens group is $f_5$, a focal length of said sixth lens group is $f_6$, an overall focal length of said second lens to said fourth lens in said intermediate lens group in said second lens group is $f_n$, and a distance from the first object to the second object is L:

$0.1 < f_1/f_3 < 17$ $0.1 < f_2/f_4 < 14$ $0.01 < f_5/L < 0.9$ $0.02 < f_6/L < 1.6$ $0.01 < f_n/f_2 < 2.0$.

49. A projection optical system according to claim 48, wherein the following condition is satisfied when a focal length of said third lens with negative refracting power in said second lens group is $f_{23}$ and a focal length of said fourth lens with negative refracting power in said intermediate lens group in said second lens group is $f_{24}$:

$0.07 < f_{24}/f_{23} < 7$.

50. A projection optical system according to claim 49, wherein the following condition is satisfied when a focal length of said second lens with negative refracting power in said intermediate lens group in said second lens group is $f_{22}$ and a focal length of said third lens with negative refracting power in said intermediate lens group in said second lens group is $f_{23}$:

$0.01 < f_{22}/f_{23} < 10$.

51. A projection optical system according to claim 49, wherein the following condition is satisfied when a focal length of said second lens with negative refracting power in said intermediate lens group in said second lens group is $f_{22}$ and a focal length of said third lens with negative refracting power in said intermediate lens group in said second lens group is $f_{23}$:

$$0.01 < f_{22}/f_{23} < 10.$$

52. A projection optical system according to claim 50, wherein the following condition is satisfied when a focal length of said first lens with positive refracting power in said intermediate lens group in second lens group is $f_{21}$ and the distance from the first object to the second object is L:

$$0.230 < f_{21}/L < 0.40.$$

53. A projection optical system according to claim 50, wherein the following condition is satisfied when a focal length of said first lens with positive refracting power in said intermediate lens group in second lens group is $f_{21}$ and the distance from the first object to the second object is L:

$$0.230 < f_{21}/L < 0.40.$$

54. A method for fabricating at least semiconductor devices or liquid crystal display devices by using a projection optical system according to claim 50, comprising the steps of:

illuminating a mask prepared as said first object with light of a predetermined wavelength, said mask being formed a predetermined pattern thereon; and projecting an image of the pattern on said mask onto a photosensitive substrate prepared as said second object through said projection optical system, thereby performing an exposure process.

55. A projection optical system according to claim 46, wherein said second lens group comprises a front lens placed as closest to the first object and having negative refracting power with a concave surface to the second object, a rear lens placed as closest to the second object and having negative refracting power with a concave surface to the first object, and an intermediate lens group placed between said front and rear lenses in said second lens group, wherein said intermediate lens group has a first lens with positive refracting power, a second lens with negative refracting power, a third lens with negative refracting power, and a fourth lens with negative refracting power in the named order from the first object toward the second object, and wherein the following conditions are satisfied when a focal length of said first lens group is $f_1$, a focal length of said second lens group is $f_2$, a focal length of said third lens group is $f_3$, a focal length of said fourth lens group is $f_4$, a focal length of said fifth lens group is $f_5$, a focal length of said sixth lens group is $f_6$, an overall focal length of said second lens to said fourth lens in said intermediate lens group in said second lens group is $f_n$, and a distance from the first object to the second object is L:

$$0.1 < f_1/f_3 < 17$$

$$0.1 < f_2/f_4 < 14$$

$$0.01 < f_5/L < 0.9$$

$$0.02 < f_6/L < 1.6$$

$$0.01 < f_n/f_2 < 2.0.$$

56. A projection optical system according to claim 55, wherein the following condition is satisfied when a focal length of said third lens with negative refracting power in said second lens group is $f_{23}$ and a focal length of said fourth lens with negative refracting power in said intermediate lens group in said second lens group is $f_{24}$:

$$0.07 < f_{24}/f_{23} < 7.$$

57. A projection optical system according to claim 47, wherein said fifth lens group comprises a negative lens placed as closest to the second object and having a concave surface opposed to the second object.

58. A projection optical system according to claim 57, wherein the following condition is satisfied when a radius of curvature of a lens surface closest to the first object in said sixth lens group is $r_{6F}$ and an axial distance from the lens surface closest to the first object in said sixth lens group to the second object is $d_6$:

$$0.50 < d_6/r_{6F} < 1.50.$$

59. A method for fabricating at least semiconductor devices or liquid crystal display devices by using a projection optical system according to claim 58, comprising the steps of:

illuminating a mask prepared as said first object with light of a predetermined wavelength, said mask being formed a predetermined pattern thereon; and projecting an image of the pattern on said mask onto a photosensitive substrate prepared as said second object through said projection optical system, thereby performing an exposure process.

60. A projection optical system according to claim 58, wherein said second lens group comprises a front lens placed as closest to the first object and having negative refracting power with a concave surface to the second object, a rear lens placed as closest to the second object and having negative refracting power with a concave surface to the first object, and an intermediate lens group placed between said front and rear lenses in said second lens group, wherein said intermediate lens group has a first lens with positive refracting power, a second lens with negative refracting power, a third lens with negative refracting power, and a fourth lens with negative refracting power in the named order from the first object toward the second object, and wherein the following conditions are satisfied when a focal length of said first lens group is $f_1$, a focal length of said second lens group is $f_2$, a focal length of said third lens group is $f_3$, a focal length of said fourth lens group is $f_4$, a focal length of said fifth lens group is $f_5$, a focal length of said sixth lens group is $f_6$, an overall focal length of said second lens to said fourth lens in said intermediate lens group in said second lens group is $f_n$, and a distance from the first object to the second object is L:

$$0.1 < f_1/f_3 < 17$$

$$0.1 < f_2/f_4 < 14$$

$$0.01 < f_5/L < 0.9$$

$$0.02 < f_6/L < 1.6$$

$$0.01 < f_n/f_2 < 2.0.$$

61. A projection optical system according to claim 60, wherein the following condition is satisfied when a focal length of said third lens with negative refracting power in said second lens group is $f_{23}$ and a focal length of said fourth lens with negative refracting power in said intermediate lens group in said second lens group is $f_{24}$:

$$0.07 < f_{24}/f_{23} < 7.$$

62. A projection optical system according to claim 61, wherein the following condition is satisfied when a focal length of said second lens with negative refracting power in said intermediate lens group in said second lens group is $f_{22}$ and a focal length of said third lens with negative refracting power in said intermediate lens group in said second lens group is $f_{23}$:

$$0.01 < f_{22}/f_{23} < 10.$$

63. A projection optical system according to claim 62, wherein the following condition is satisfied when a focal length of said first lens with positive refracting power in said intermediate lens group in second lens group is $f_{21}$ and the distance from the first object to the second object is L:

$$0.230 < f_{21}/L < 0.40.$$

64. A method for fabricating at least semiconductor devices or liquid crystal display devices by using a projection optical system according to claim 44, comprising the steps of:
illuminating a mask prepared as said first object with light of a predetermined wavelength, said mask being formed a predetermined pattern thereon; and
projecting an image of the pattern on said mask onto a photosensitive substrate prepared as said second object through said projection optical system, thereby performing an exposure process.

65. A projection optical system located between a first object and a second object, for projecting an image of the first object onto the second object, said projection optical system having:
a first lens group with positive refracting power, said first lens group being placed between the first and second objects;
a second lens group with negative refracting power, said second lens group being placed between said first lens group and the second object;
a third lens group with positive refracting power, said third lens group being placed between said second lens group and the second object;
a fourth lens group with negative refracting power, said fourth lens group being placed between said third lens group and the second object;
a fifth lens group with positive refracting power, said fifth lens group being placed between said fourth lens group and the second object; and
a sixth lens group with positive refracting power, said sixth lens group being placed between said fifth lens group and the second object,
wherein said first lens group includes at least two positive lenses, said third lens group includes at least three positive lenses, said fourth lens group includes at least three negative lenses, said fifth lens group includes at least five positive lenses and at least one negative lens, and said sixth lens group includes at least one positive lens,
wherein said fourth lens group comprises a front lens placed as closest to the first object and having negative refracting power with a concave surface to the second object, a rear lens placed as closest to the second object and having negative refracting power with a concave surface to the first object, and at least one negative lens placed between said front lens in said fourth lens group and said rear lens in said fourth lens group, and
wherein the following condition is satisfied when a radius of curvature on the first object side in said rear lens placed as closest to the second object in said fourth lens group is $r_{4F}$ and a radius of curvature on the second object side in said rear lens placed as closest to the second object in said fourth lens group is $r_{4R}$:

$$-1.00 \leq (r_{4F}-r_{4R})/(r_{4F}+r_{4R}) < 0.$$

66. A method for fabricating at least semiconductor devices or liquid crystal display devices by using a projection optical system according to claim 65, comprising the steps of:
illuminating a mask prepared as said first object with light of a predetermined wavelength, said mask being formed a predetermined pattern thereon; and
projecting an image of the pattern on said mask onto a photosensitive substrate prepared as said second object through said projection optical system, thereby performing an exposure process.

67. A projection optical system according to claim 65, wherein said fifth lens group comprises a negative meniscus lens, and a positive lens placed as adjacent to a concave surface of said negative meniscus lens and having a convex surface opposed to the concave surface of said negative meniscus lens, and
wherein the following condition is satisfied when a radius of curvature of the concave surface of said negative meniscus lens in said fifth lens group is $r_{5n}$ and a radius of curvature of the convex surface opposed to the concave surface of said negative meniscus lens in said positive lens placed adjacent to the concave surface of said negative meniscus lens in said fifth lens group is $r_{5p}$:

$$0 < (r_{5p}-r_{5n})/(r_{5p}+r_{5n}) < 1.$$

68. A projection optical system according to claim 67, wherein said negative meniscus lens and said positive lens adjacent to the concave surface of said negative meniscus lens are placed between positive lenses in said fifth lens group.

69. A method for fabricating at least semiconductor devices or liquid crystal display devices by using a projection optical system according to claim 68, comprising the steps of:
illuminating a mask prepared as said first object with light of a predetermined wavelength, said mask being formed a predetermined pattern thereon; and
projecting an image of the pattern on said mask onto a photosensitive substrate prepared as said second object through said projection optical system, thereby performing an exposure process.

70. An exposure apparatus comprising:
a stage allowing a photosensitive substrate to be held on a main surface thereof;
an illumination optical system for emitting exposure light of a predetermined wavelength and transferring a predetermined pattern on a mask onto said substrate; and
a projecting optical system for projecting an image of the pattern on said mask onto said substrate, said projecting optical system being provided between said mask and said substrate and having:
a first lens group with positive refracting power, said first lens group being placed between said mask and said substrate;
a second lens group with negative refracting power, said second lens group being placed between said first lens group and said substrate;
a third lens group with positive refracting power, said third lens group being placed between said second lens group and said substrate;
a fourth lens group with negative refracting power, said fourth lens group being placed between said third lens group and said substrate;
a fifth lens group with positive refracting power, said fifth lens group being placed between said fourth lens group and said substrate; and
a sixth lens group with positive refracting power, said sixth lens group being placed between said fifth lens group and said substrate,
wherein said first lens group includes at least two positive lenses, said third lens group includes at least three positive lenses, said fourth lens group includes at least three negative lenses, said fifth lens group includes at least five positive lenses and at least one negative lens, and said sixth lens group includes at least one positive lens, and
wherein said fifth lens group comprises a negative meniscus lens, and a positive lens placed as adjacent to a concave surface of said negative meniscus lens and having a convex surface opposed to the concave surface of said negative meniscus lens.

71. An exposure apparatus according to claim 70, wherein said negative meniscus lens and said positive lens adjacent to the concave surface of said negative meniscus lens are placed between positive lenses in said fifth lens group.

72. A projection optical system located between a first object and a second object, for projecting an image of the first object onto the second object, said projection optical system having:
a first lens group with positive refracting power, and first lens group being placed between the first and second objects;
a second lens group with negative refracting power, said second lens group being placed between said first lens group and the second object;
a third lens group with positive refracting power, said third lens group being placed between said second lens group and the second object;
a fourth lens group with negative refracting power, said fourth lens group being placed between said third lens group and the second object;
a fifth lens group with positive refracting power, said fifth lens group being placed between said fourth lens group and the second object; and
a sixth lens group with positive refracting power, said six lens group being placed between said fifth lens group and the second object,
wherein said first lens group includes at least two positive lenses, said third lens group includes at least three positive lenses, said fourth lens group includes at least three negative lenses, said fifth lens group includes at least five positive lenses and at least one negative lens, and said sixth lens group includes at least one positive lens,
wherein said second lens group comprises a front lens placed as closest to the first object and having negative refracting power with a concave surface to the second object, a rear lens placed as closest to the second object and having negative refracting power with a concave surface to the first object, and an intermediate lens group placed between said front and rear lenses in said second lens group, and
wherein said intermediate lens group includes a positive lens and a negative lens.

73. A projection optical system according to claim 72, wherein the following condition is satisfied when an axial distance from the first object to a first-object-side focal point of the whole of said projection optical system is I and the distance from the first object to the second object is L:

$$1.0 < I/L.$$

74. A projection optical system according to claim 73, wherein said fourth lens group comprises a front lens placed as closest to the first object and having negative refracting power with a concave surface to the second object, a rear lens placed as closest to the second object and having negative refracting power with a concave surface to the first object, and at least one negative lens placed between said front lens in said fourth lens group and said rear lens in said fourth lens group.

75. A projection optical system according to claim 73, wherein said fifth lens group comprises a negative meniscus lens, and a positive lens placed as adjacent to a concave surface of said negative meniscus lens and having a convex surface opposed to the concave surface of said negative meniscus lens.

76. A projection optical system according to claim 75, wherein said negative meniscus lens and said positive lens adjacent to the concave surface of said negative meniscus lens are placed between positive lenses in said fifth lens group.

77. A projection optical system according to claim 76, wherein said fifth lens group comprises a negative lens placed as closest to the second object and having a concave surface opposed to the second object.

78. A projection optical system according to claim 77, wherein said sixth lens group comprises a lens placed as closest to the first object and having a convex surface opposed to the first object.

79. A projection optical system according to claim 74, wherein said fifth lens group comprises a negative meniscus lens, and a positive lens placed as adjacent to a concave surface of said negative meniscus lens and having a convex surface opposed to the concave surface of said negative meniscus lens.

80. A projection optical system according to claim 79, wherein said negative meniscus lens and said positive lens adjacent to the concave surface of said negative meniscus lens are placed between positive lenses in said fifth lens group.

81. A projection optical system according to claim 80, wherein said fifth lens group comprises a negative lens placed as closest to the second object and having a concave surface opposed to the second object.

82. A method for fabricating at least semiconductor devices or liquid crystal display devices by using a projection optical system according to claim 80, comprising the steps of:
illuminating a mask prepared as said first object with light of a predetermined wavelength, said mask being formed a predetermined pattern thereon; and
projecting an image of the pattern on said mask onto a photosensitive substrate prepared as said second object through said projection optical system, thereby performing an exposure process.

83. A projection optical system according to claim 81, wherein said sixth lens group comprises a lens placed as closest to the first object and having a convex surface opposed to the first object.

84. A method for fabricating at least semiconductor devices or liquid crystal display devices by using a projection optical system according to claim 72, comprising the steps of:

illuminating a mask prepared as said first object with light of a predetermined wavelength, said mask being formed a predetermined pattern thereon; and projecting an image of the pattern on said mask onto a photosensitive substrate prepared as said second object through said projection optical system, thereby performing an exposure process.

* * * * *